US012652924B2

(12) United States Patent
Aoki et al.

(10) Patent No.: US 12,652,924 B2
(45) Date of Patent: Jun. 9, 2026

(54) DISPLAY DEVICE

(71) Applicant: Magnolia White Corporation, Tokyo (JP)

(72) Inventors: Hayata Aoki, Tokyo (JP); Shinya Asakura, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 456 days.

(21) Appl. No.: 18/466,016

(22) Filed: Sep. 13, 2023

(65) Prior Publication Data

US 2024/0090297 A1     Mar. 14, 2024

(30) Foreign Application Priority Data

Sep. 13, 2022     (JP) ................................. 2022-145414

(51) Int. Cl.
   *H10K 59/80*         (2023.01)
   *H10K 59/35*         (2023.01)
   *H10K 102/00*        (2023.01)
(52) U.S. Cl.
   CPC ......... H10K 59/353 (2023.02); H10K 59/871 (2023.02); *H10K 2102/351* (2023.02)
(58) Field of Classification Search
   CPC ............... H10K 59/353; H10K 59/871; H10K 2102/351; H10K 59/352; H10K 59/122; H10K 59/124; H10K 59/80515
   See application file for complete search history.

(56) References Cited

U.S. PATENT DOCUMENTS

| | | | |
|---|---|---|---|
| 2015/0179978 A1 | 6/2015 | Sato | |
| 2017/0148860 A1* | 5/2017 | Park | ...................... H10K 59/122 |
| 2021/0066643 A1* | 3/2021 | Choi | ................ H10K 59/80515 |
| 2022/0130925 A1* | 4/2022 | Takahashi | .............. H10K 50/11 |

FOREIGN PATENT DOCUMENTS

| | | |
|---|---|---|
| JP | 2005-174914 A | 6/2005 |
| JP | 2008-235605 A | 10/2008 |
| JP | 2011-018468 A | 1/2011 |
| JP | 2015-122248 A | 7/2015 |

* cited by examiner

*Primary Examiner* — Donald L Raleigh
(74) *Attorney, Agent, or Firm* — XSENSUS LLP

(57)          ABSTRACT

According to one embodiment, a display device includes a first lower electrode, a second lower electrode and a third lower electrode, a rib including apertures, a first organic layer provided on the first lower electrode, a second organic layer provided on the second lower electrode, a third organic layer provided on the third lower electrode, and an upper electrode. At least one of the first lower electrode, the second lower electrode and the third lower electrode includes a flat portion and a plurality of inclined portions which incline relative to the flat portion in the aperture. The inclined portions are arrayed in matrix in first and second directions which intersect each other in plan view.

20 Claims, 23 Drawing Sheets

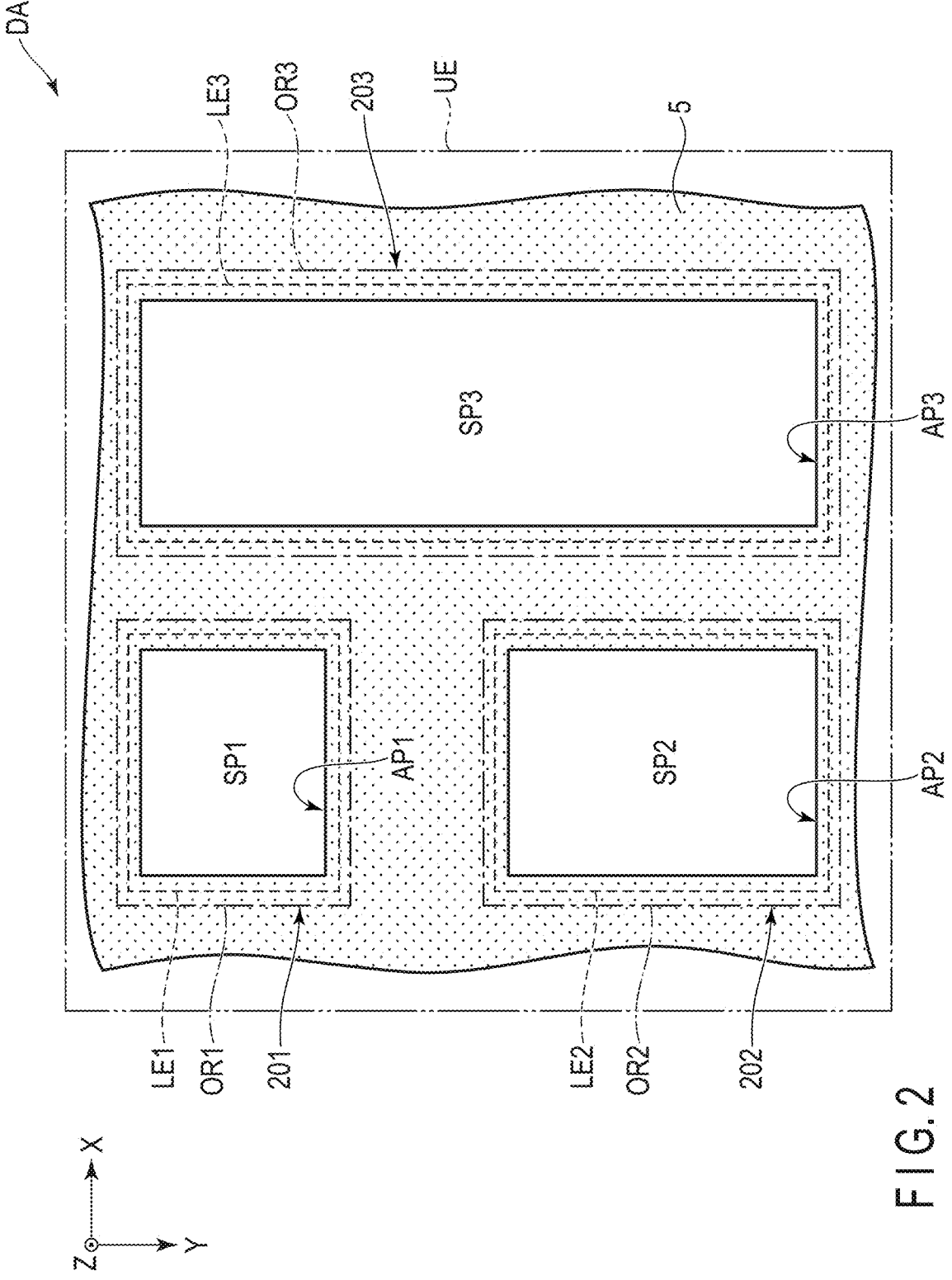
F I G. 2

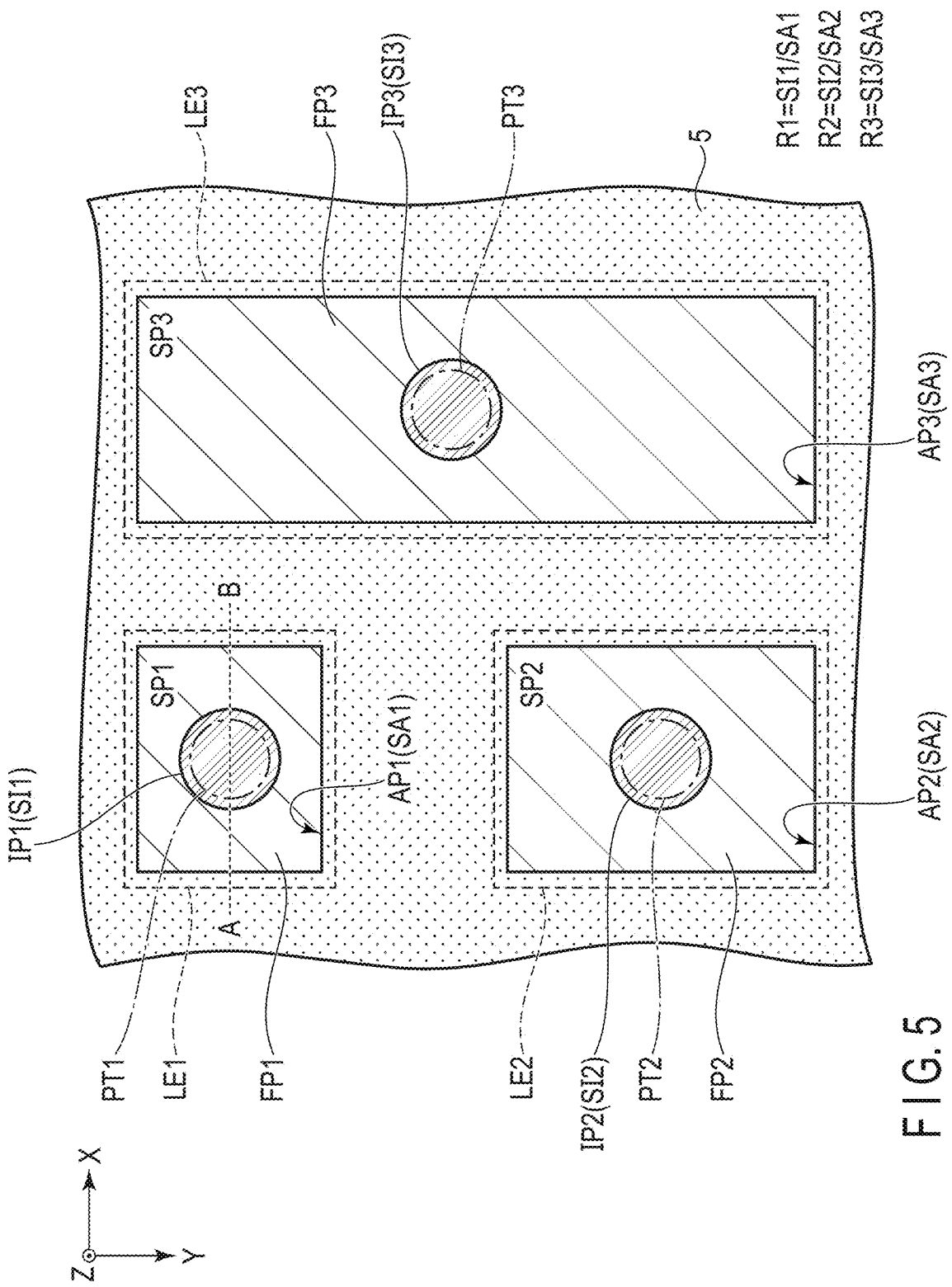
F I G. 5

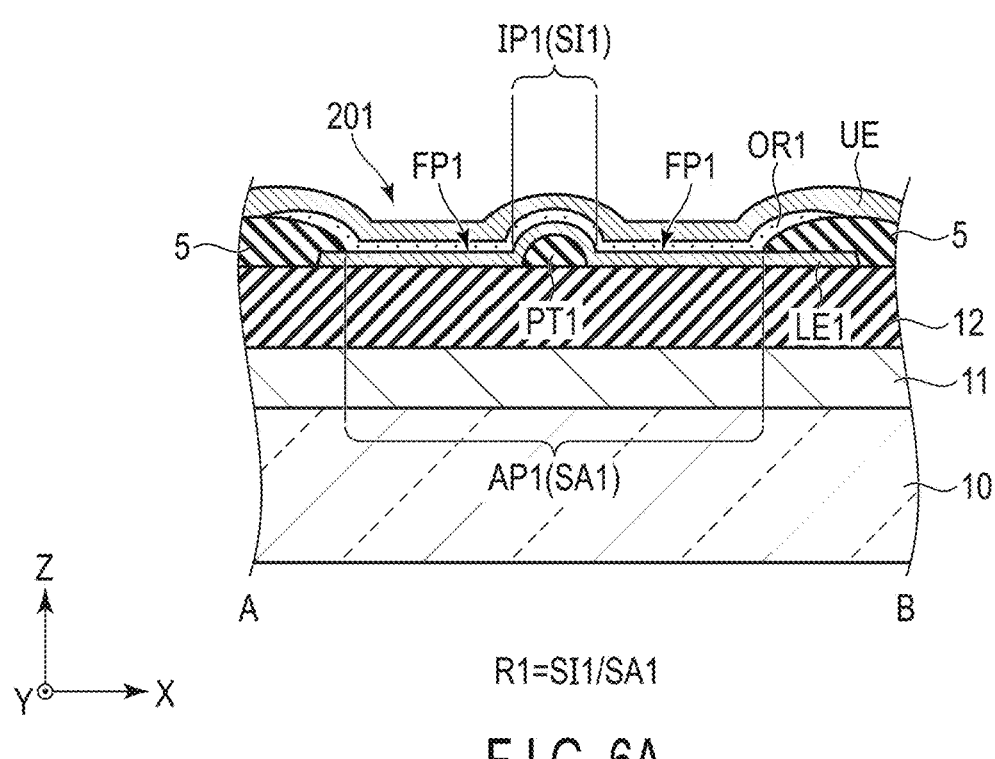
R1=SI1/SA1
F I G. 6A
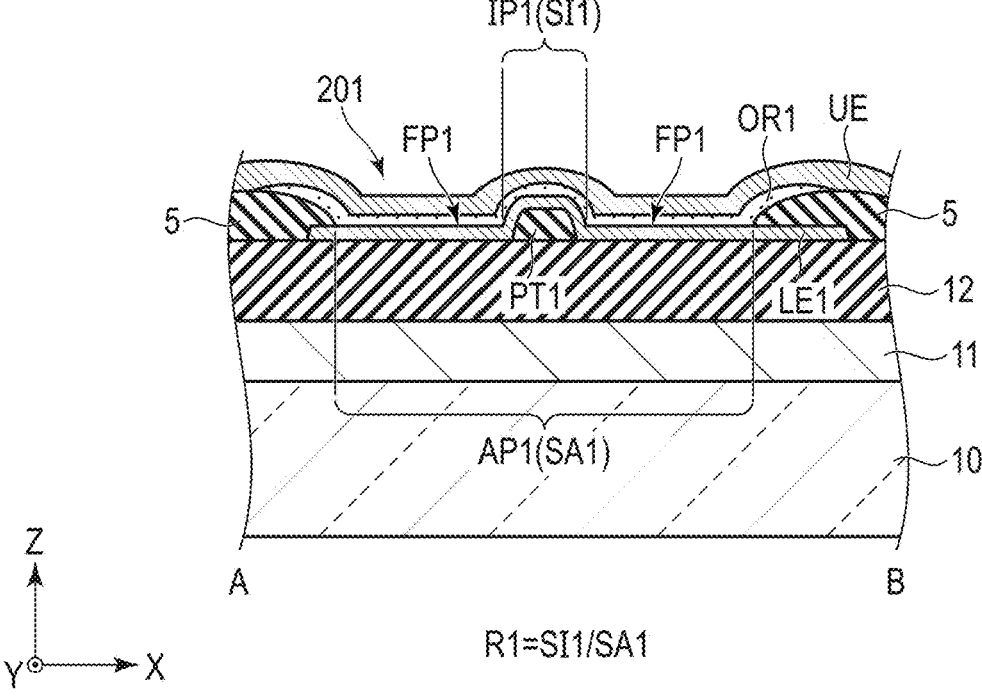
R1=SI1/SA1
F I G. 6B

R0<R11<R12<R13

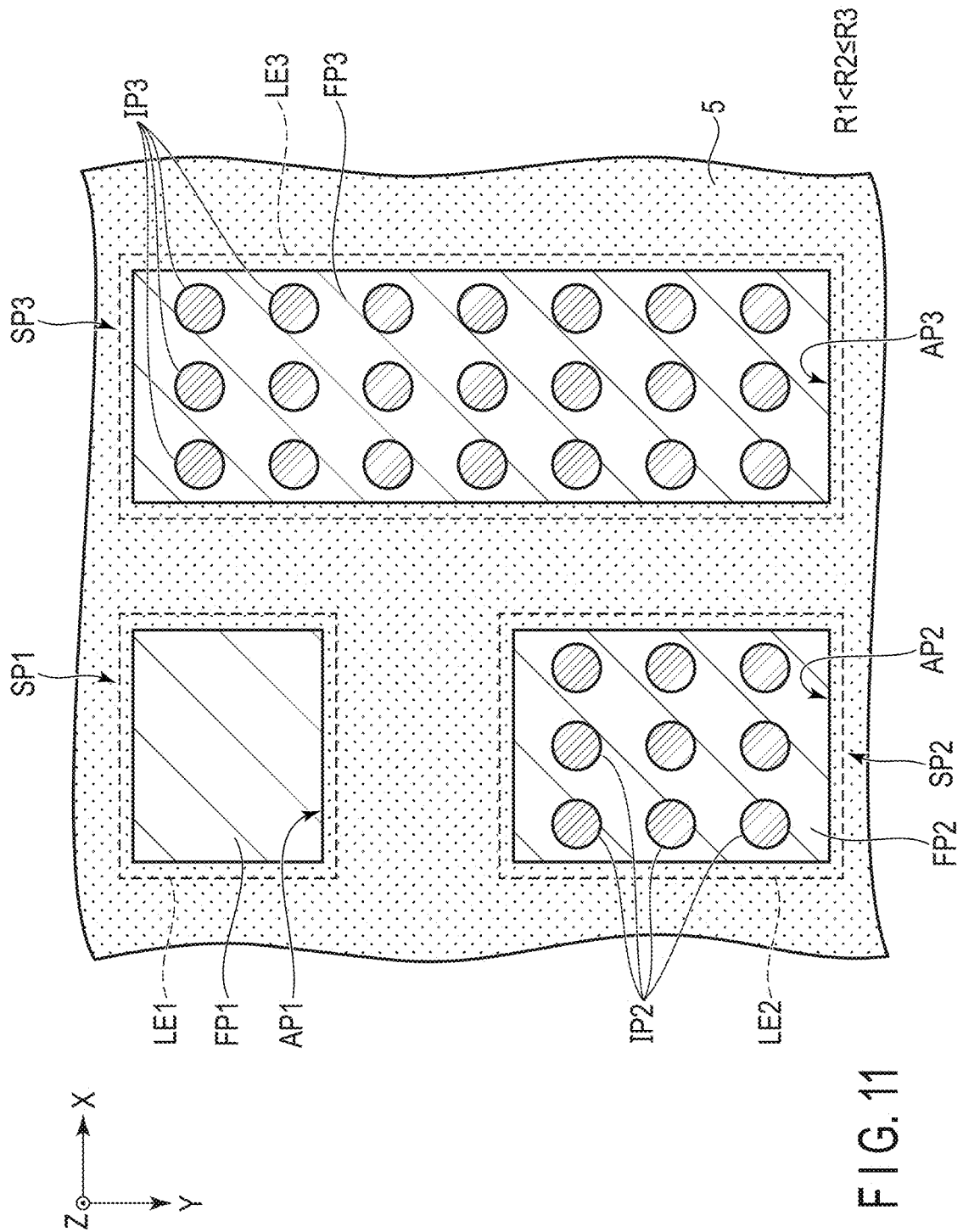
F I G. 11

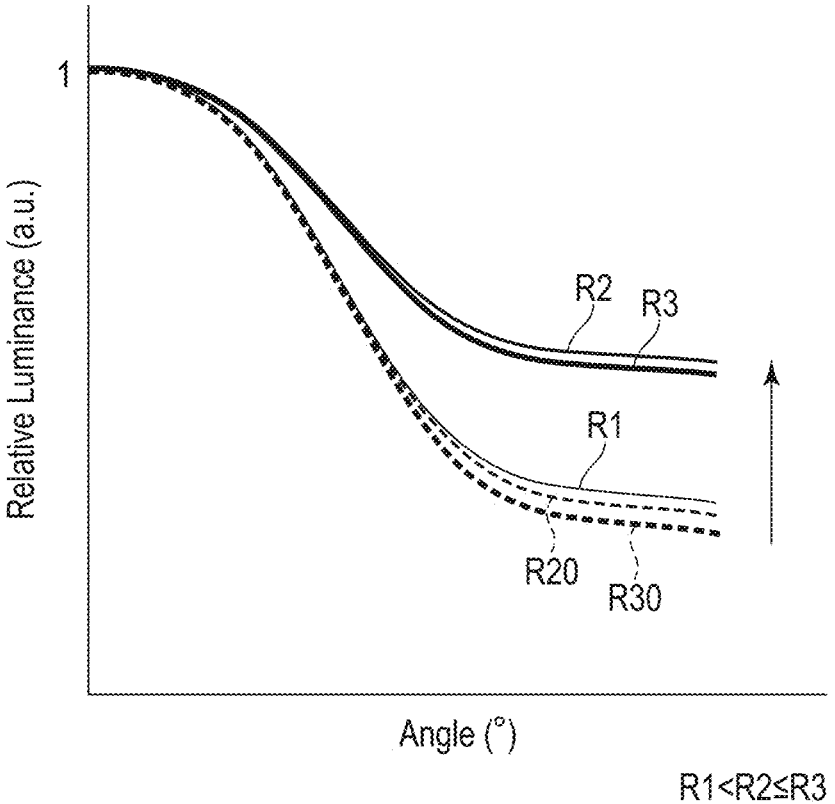
R1<R2≤R3
F I G. 12

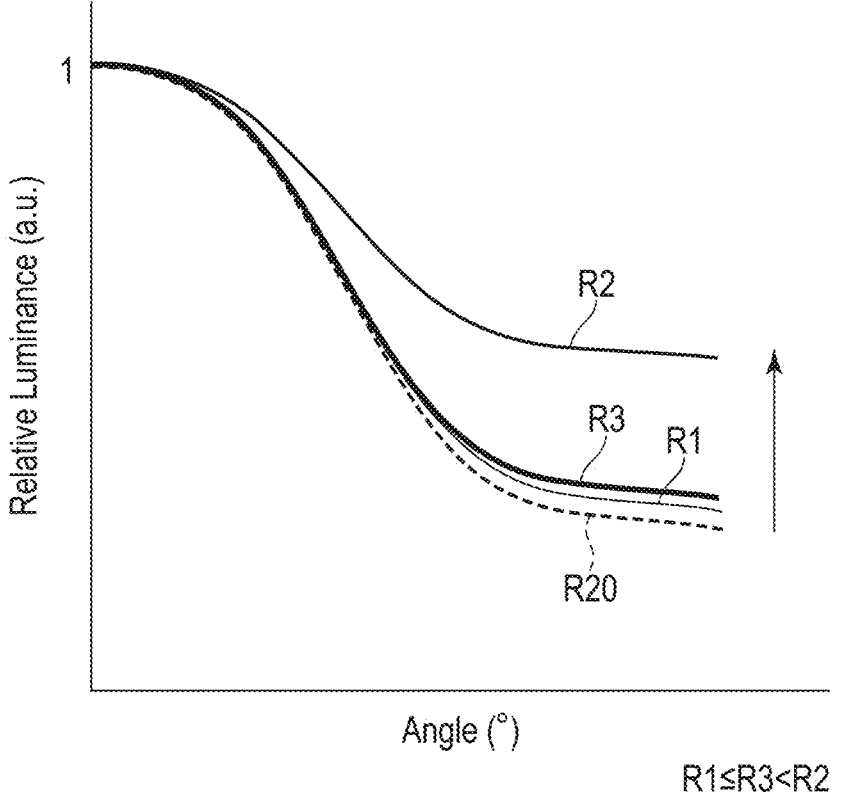
R1≤R3<R2
F I G. 14

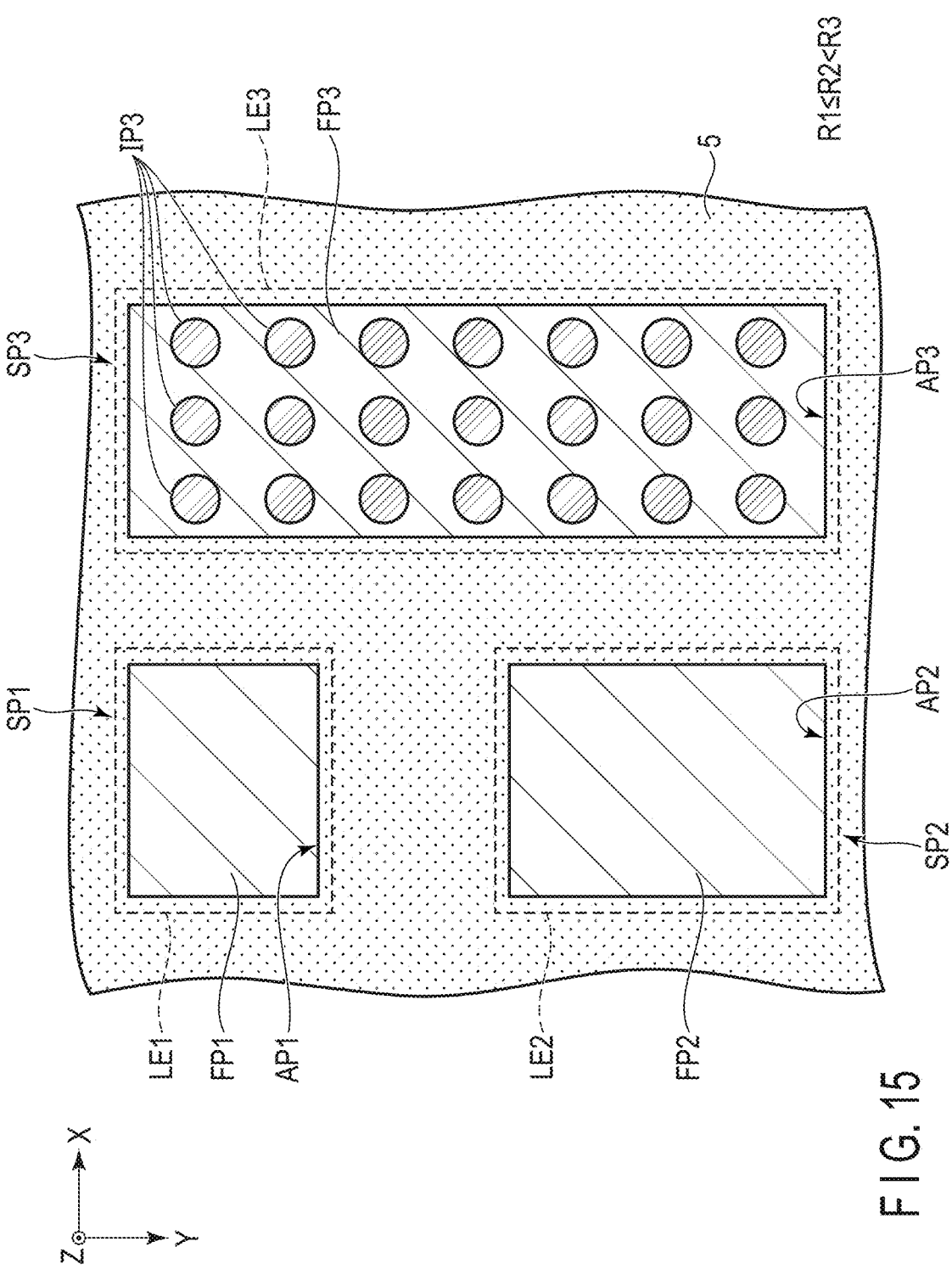
F I G. 15

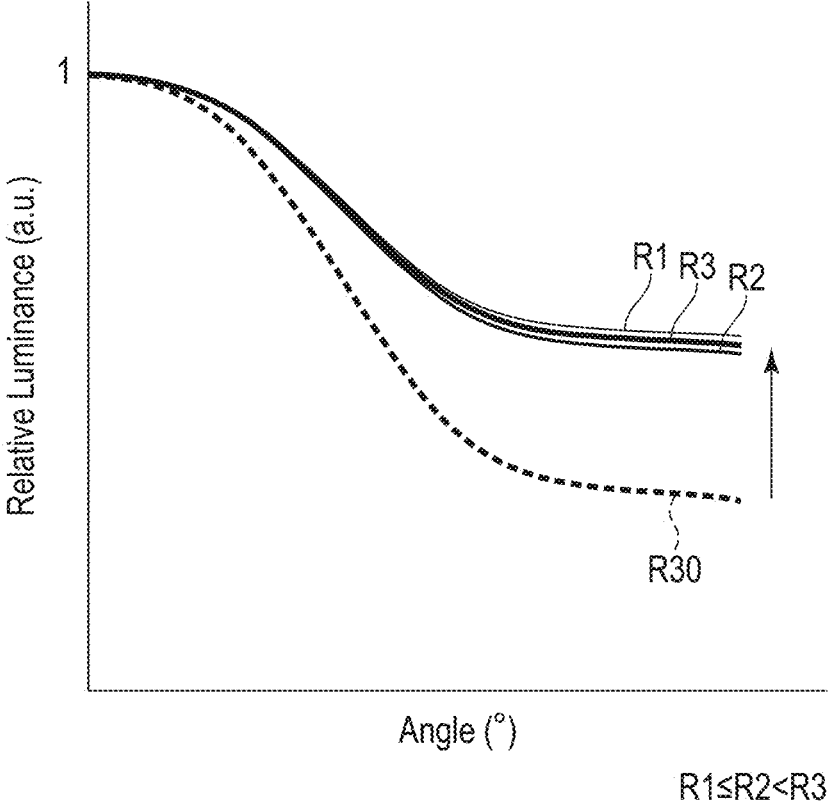
R1≤R2<R3
F I G. 16

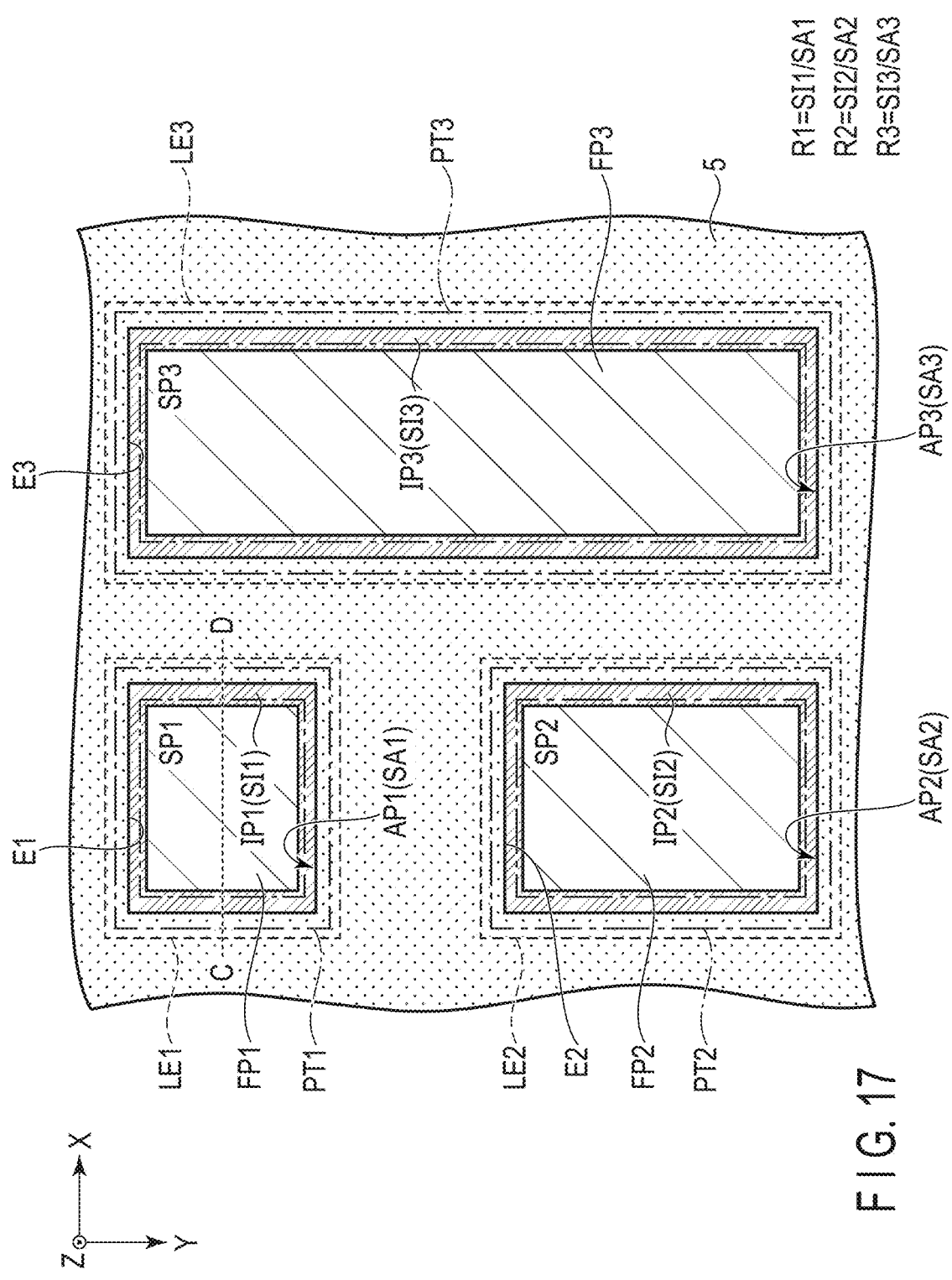
F I G. 17

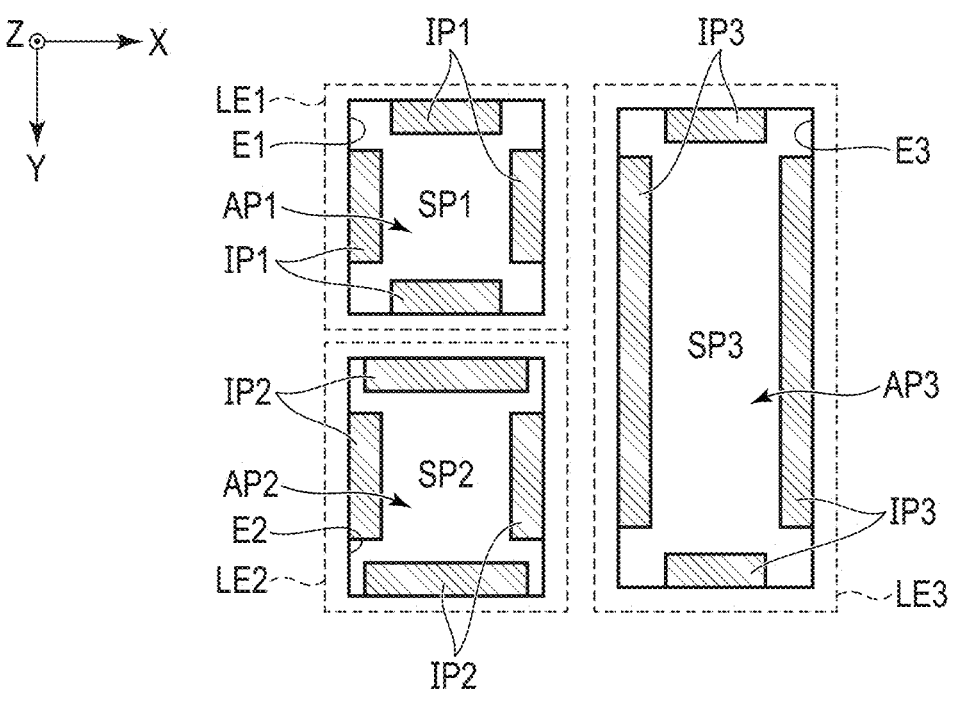
F I G. 19
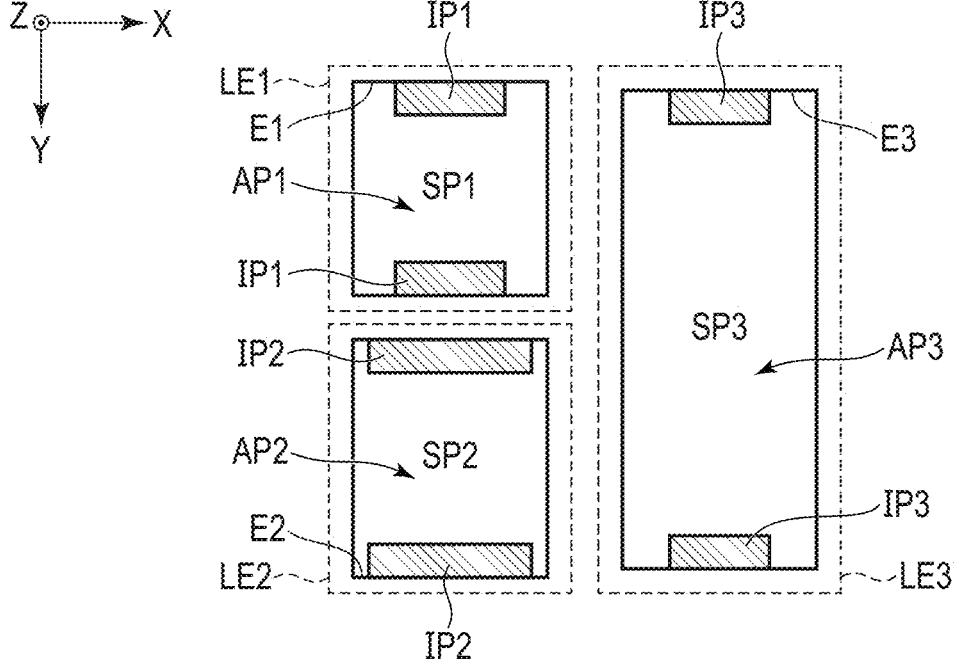
F I G. 20

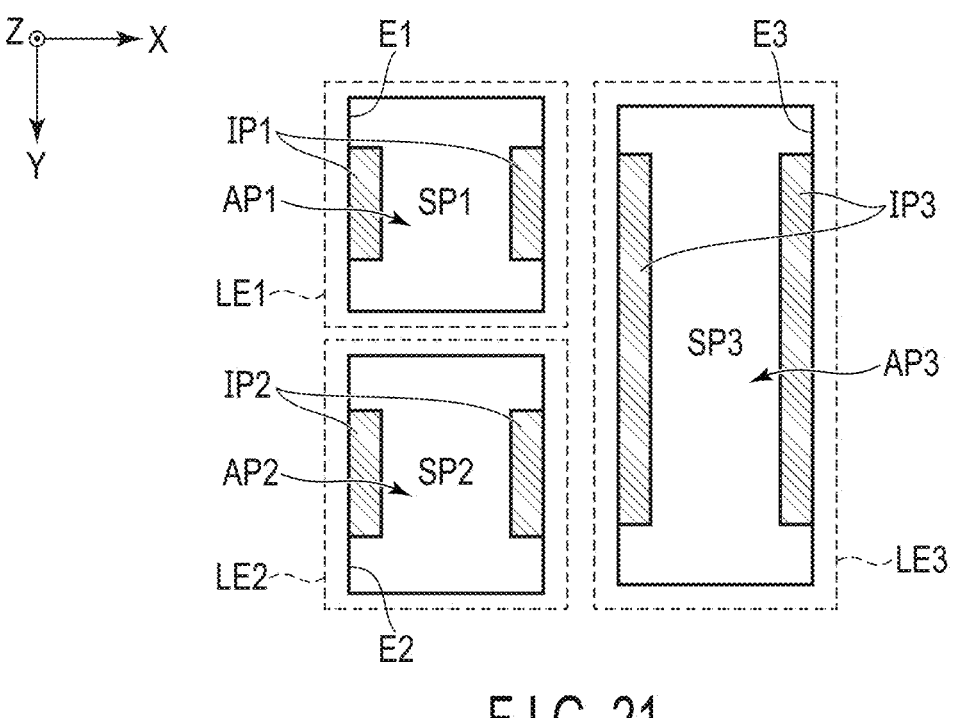
F I G. 21
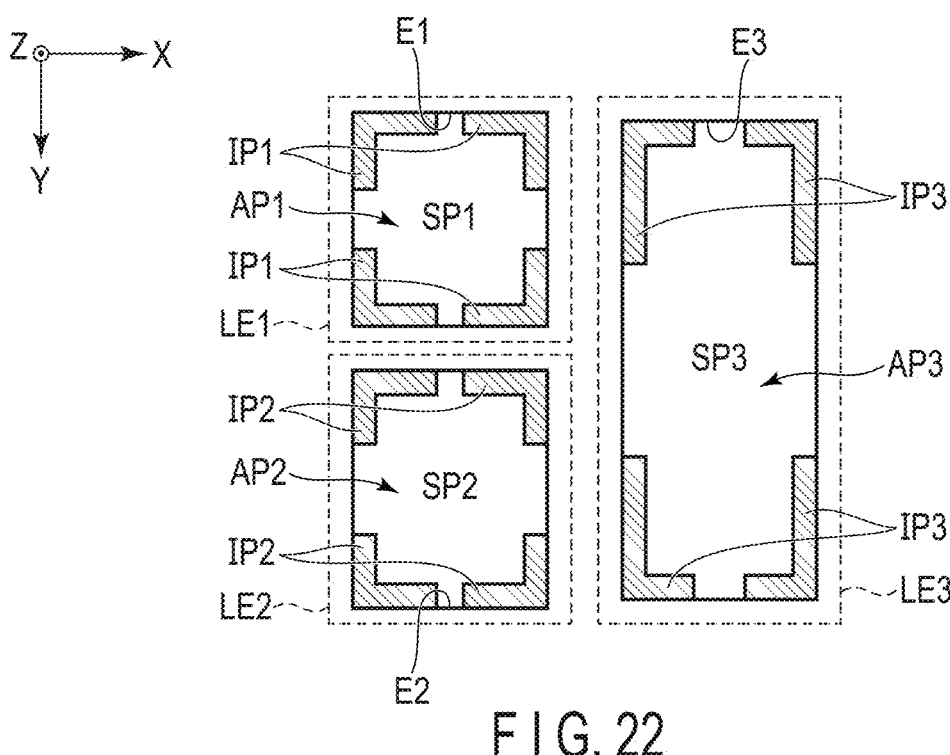
F I G. 22

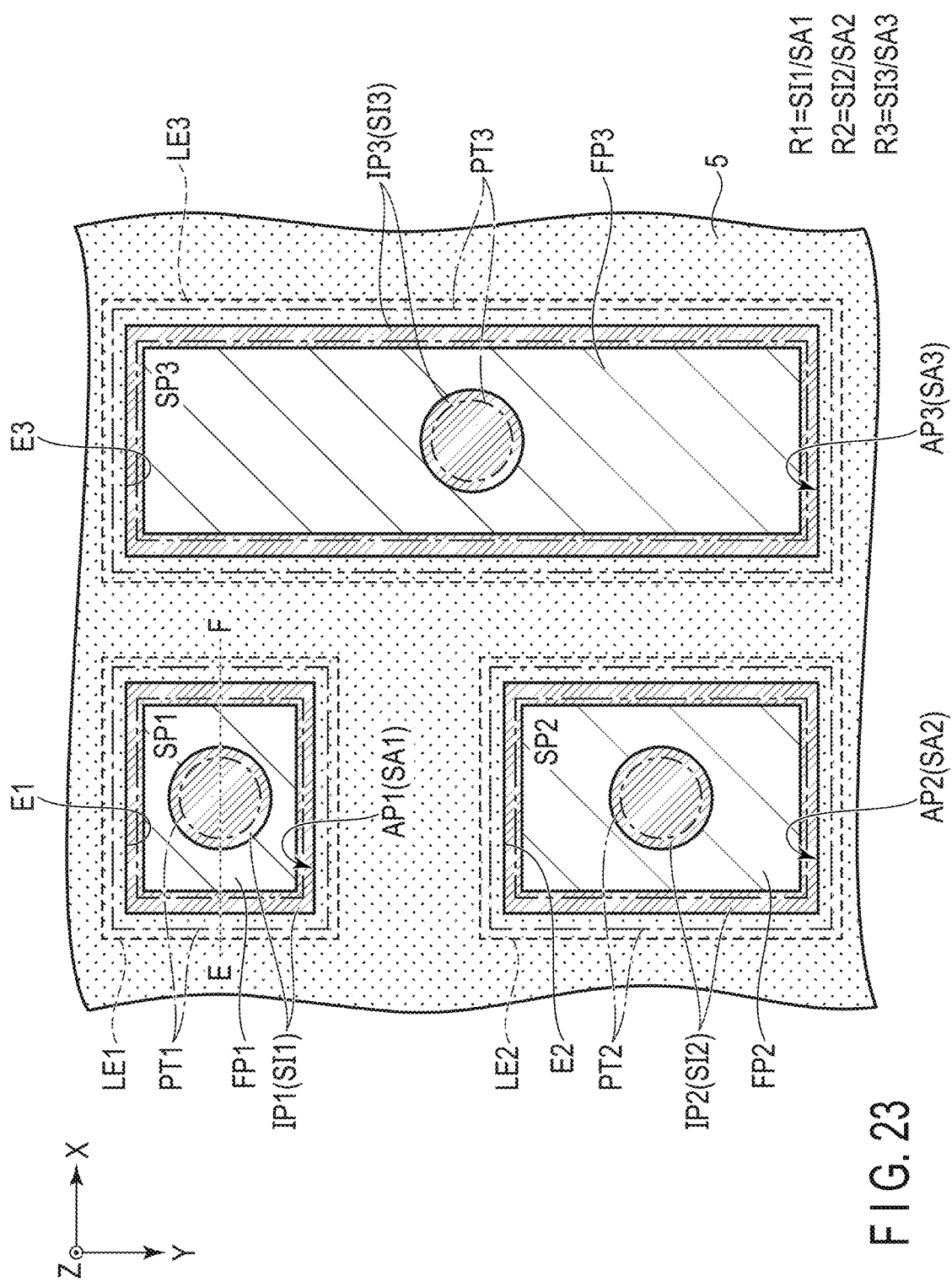
R1=SI1/SA1
R2=SI2/SA2
R3=SI3/SA3
F I G. 23

R1=SI1/SA1

R1=SI1/SA1

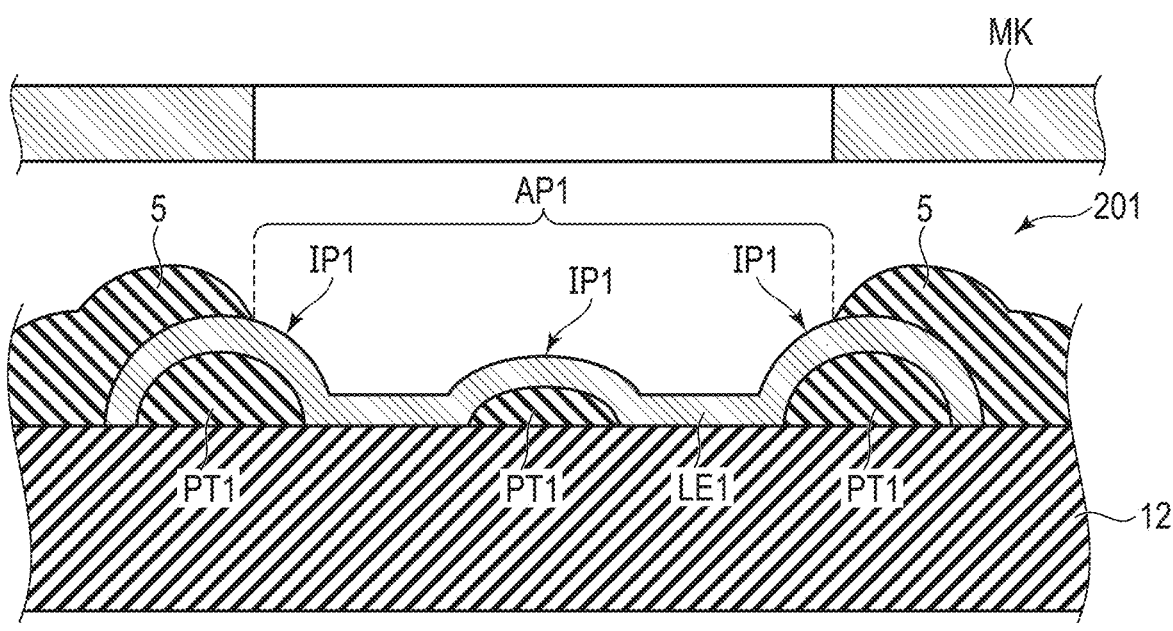
F I G. 25

IP1    201

SE2
13
SE1
5
12

LE1    PT1  OR1  UE

IP1    T1   T2    201

SE2
13
SE1
5
12

LE1    PT1  OR1  UE

FP1

DISPLAY DEVICE

CROSS-REFERENCE TO RELATED APPLICATIONS

This application is based upon and claims the benefit of priority from Japanese Patent Application No. 2022-145414, filed Sep. 13, 2022, the entire contents of which are incorporated herein by reference.

FIELD

Embodiments described herein relate generally to a display device.

BACKGROUND

Recently, display devices to which an organic light emitting diode (OLED) is applied as a display element have been put into practical use. The display element comprises a lower electrode connected to a pixel circuit, an upper electrode facing the lower electrode, and an organic layer between the lower electrode and the upper electrode.

In this display element, a technique for forming the base of the lower electrode into an uneven shape is known.

BRIEF DESCRIPTION OF THE DRAWINGS

FIG. 2 is a diagram showing an example of the layout of subpixels SP1, SP2 and SP3.

FIG. 5 is a plan view showing configuration example 1.

FIG. 6A is a cross-sectional view of a display element 201 along the A-B line of FIG. 5.

FIG. 6B is another cross-sectional view of the display element 201 along the A-B line of FIG. 5.

FIG. 11 is a plan view for explaining embodiment 2.

FIG. 12 is a diagram for explaining viewing angle characteristics in embodiment 2.

FIG. 14 is a diagram for explaining viewing angle characteristics in embodiment 3.

FIG. 15 is a plan view for explaining embodiment 4.

FIG. 16 is a diagram for explaining viewing angle characteristics in embodiment 4.

FIG. 17 is a plan view showing configuration example 2.

FIG. 19 is a diagram showing examples of the shapes of inclined portions IP1, IP2 and IP3.

FIG. 20 is a diagram showing examples of the shapes of the inclined portions IP1, IP2 and IP3.

FIG. 21 is a diagram showing examples of the shapes of the inclined portions IP1, IP2 and IP3.

FIG. 22 is a diagram showing examples of the shapes of the inclined portions IP1, IP2 and IP3.

FIG. 23 is a plan view showing configuration example 3.

FIG. 25 is a diagram for explaining a process for forming an organic layer OR1 in the display element 201 shown in FIG. 24A.

DETAILED DESCRIPTION

Figure 1:
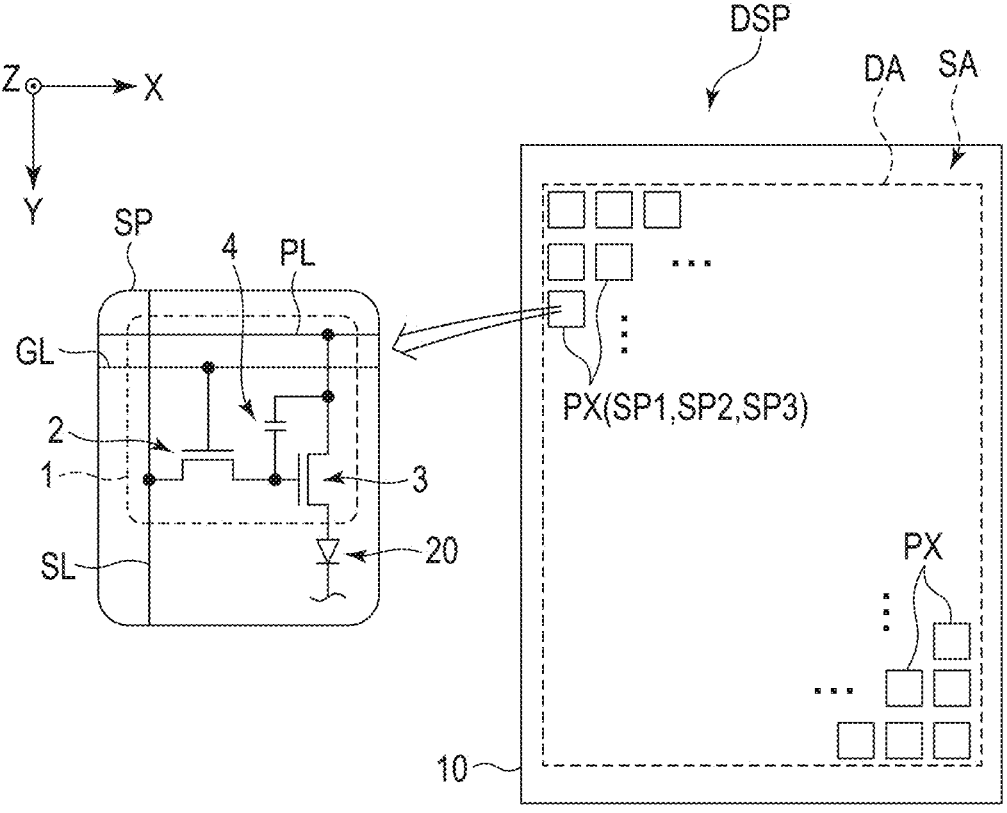
FIG. 1 is a diagram showing a configuration example of a display device DSP.

Embodiments described herein aim to provide a display device with improved viewing angle characteristics.

In general, according to one embodiment, a display device comprises a substrate, first, second and third lower electrodes provided above the substrate, a rib comprising apertures which overlap the first lower electrode, the second lower electrode and the third lower electrode, respectively, a first organic layer configured to emit light which exhibits a first color and provided on the first lower electrode, a second organic layer configured to emit light which exhibits a second color different from the first color and provided on the second lower electrode, a third organic layer configured to emit light which exhibits a third color different from the first color and the second color and provided on the third lower electrode, and an upper electrode provided on the first organic layer, the second organic layer and the third organic layer. At least one of the first lower electrode, the second lower electrode and the third lower electrode comprises a flat portion and a plurality of inclined portions which incline relative to the flat portion in the aperture. The inclined portions are arrayed in matrix in first and second directions which intersect each other in plan view.

According to another embodiment, a display device comprises a substrate, first, second and third lower electrodes provided above the substrate, a rib comprising apertures which overlap the first lower electrode, the second lower electrode and the third lower electrode, respectively, a first organic layer configured to emit light which exhibits a first color and provided on the first lower electrode, a second organic layer configured to emit light which exhibits a second color different from the first color and provided on the second lower electrode, a third organic layer configured to emit light which exhibits a third color different from the first color and the second color and provided on the third lower electrode, and an upper electrode provided on the first organic layer, the second organic layer and the third organic layer. At least one of the first lower electrode, the second lower electrode and the third lower electrode comprises a flat portion and an inclined portion which inclines relative to the flat portion in the aperture. The inclined portion is provided along an edge of the aperture.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction. A direction parallel to the Y-axis is referred to as a second direction. A direction parallel to the Z-axis is referred to as a third direction. When various types of elements are viewed parallel to the third direction Z, the appearance is defined as a plan view.

The display device of the present embodiment is an organic electroluminescent display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP.

The display device DSP comprises a display area DA which displays an image and a surrounding area SA around the display area DA on an insulating substrate 10. The substrate 10 may be glass or a resinous film having flexibility.

In the present embodiment, the substrate 10 is rectangular in plan view. It should be noted that the shape of the substrate 10 in plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes subpixel SP1 which exhibits a first color, subpixel SP2 which exhibits a second color and subpixel SP3 which exhibits a third color. The first color, the second color and the third color are different colors. It should be noted that each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element 20 driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the anode of the display element 20.

It should be noted that the configuration of the pixel circuit 1 is not limited to the example shown in the figure.

For example, the pixel circuit 1 may comprise more thin-film transistors and capacitors.

The display element 20 is an organic light emitting diode (OLED) as a light emitting element, and may be called an organic EL element.

Although not described in detail, a terminal for connecting an IC chip and a flexible printed circuit is provided in the surrounding area SA.

FIG. 2 is a diagram showing an example of the layout of subpixels SP1, SP2 and SP3.

In the example of FIG. 2, subpixels SP1 and SP2 are arranged in the second direction Y. Further, each of subpixels SP1 and SP2 is adjacent to subpixel SP3 in the first direction X.

When subpixels SP1, SP2 and SP3 are provided in line with this layout, in the display area DA, a column in which subpixels SP1 and SP2 are alternately provided in the second direction Y and a column in which a plurality of subpixels SP3 are provided in the second direction Y are formed. These columns are alternately arranged in the first direction X.

A rib 5 is provided in the display area DA. The rib 5 comprises apertures AP1, AP2 and AP3 in subpixels SP1, SP2 and SP3, respectively.

Subpixels SP1, SP2 and SP3 comprise display elements 201, 202 and 203, respectively, as the display elements 20.

Subpixel SP1 comprises a lower electrode LE1 and an organic layer OR1 overlapping the aperture AP1. The organic layer OR1 includes a light emitting layer which emits light exhibiting the first color.

Subpixel SP2 comprises a lower electrode LE2 and an organic layer OR2 overlapping the aperture AP2. The organic layer OR2 includes a light emitting layer which emits light exhibiting the second color.

Subpixel SP3 comprises a lower electrode LE3 and an organic layer OR3 overlapping the aperture AP3. The organic layer OR3 includes a light emitting layer which emits light exhibiting the third color.

An upper electrode UE is provided over subpixels SP1, SP2 and SP3 and overlaps the organic layers OR1, OR2 and OR3. It should be noted that the upper electrode UE may be provided individually for each of subpixels SP1, SP2 and SP3 and may be electrically connected to a common feed line.

The lower electrode LE1, the organic layer OR1 and the upper electrode UE are stacked in this order and constitute the display element 201 of subpixel SP1. The lower electrode LE2, the organic layer OR2 and the upper electrode UE are stacked in this order and constitute the display element 202 of subpixel SP2. The lower electrode LE3, the organic layer OR3 and the upper electrode UE are stacked in this order and constitute the display element 203 of subpixel SP3.

In the example of FIG. 2, the outer shapes of the lower electrodes LE1, LE2 and LE3 are shown by dotted lines. The outer shapes of the organic layers OR1, OR2 and OR3 are shown by one-dot chain lines. The upper electrode UE is shown by two-dot chain lines. The peripheral portion of each of the lower electrodes LE1, LE2 and LE3 and the peripheral portion of each of the organic layers OR1, OR2 and OR3 overlap the rib 5. It should be noted that the outer shape of each of the lower electrodes, organic layers and upper electrode shown in the figure does not necessarily reflect the accurate shape.

Each of the organic layers OR1, OR2 and OR3 consists of a stacked layer body including various functional layers such as a hole injection layer, a hole transport layer, an electron blocking layer, a hole blocking layer, an electron transport layer and an electron injection layer in addition to a light emitting layer. In the example shown in FIG. 2, each of these organic layers OR1, OR2 and OR3 is an individual layer in which all layers are provided for each subpixel. It should be noted that the organic layers OR1, OR2 and OR3 may be a common layer in which all layers are provided over a plurality of subpixels. The organic layers OR1, OR2 and OR3 may be a combination of an individual layer and a common layer. The layers which should be formed as individual layers or common layers or the colors of the subpixels which should be formed as individual layers can be appropriately selected. The thickness of each individual layer may differ depending on the subpixel.

The lower electrodes LE1, LE2 and LE3 correspond to, for example, the anodes of the display elements. The upper electrode UE corresponds to the cathodes of the display elements or a common electrode.

The lower electrode LE1 is connected to the pixel circuit 1 (see FIG. 1) of subpixel SP1. The lower electrode LE2 is connected to the pixel circuit 1 of subpixel SP2. The lower electrode LE3 is connected to the pixel circuit 1 of subpixel SP3.

In the example of FIG. 2, the area of the aperture AP1 which overlaps the lower electrode LE1, the area of the aperture AP2 which overlaps the lower electrode LE2 and the area of the aperture AP3 which overlaps the lower electrode LE3 are different from each other. The area of the aperture AP2 is greater than that of the aperture AP1, and the area of the aperture AP3 is greater than that of the aperture AP2. In other words, the area of the lower electrode LE2 exposed from the aperture AP2 is greater than that of the lower electrode LE1 exposed from the aperture AP1. The area of the lower electrode LE3 exposed from the aperture AP3 is greater than that of the lower electrode LE2 exposed from the aperture AP2.

For example, the display element 201 of subpixel SP1 is configured to emit light in a red wavelength range as the first color. The display element 202 of subpixel SP2 is configured to emit light in a green wavelength range as the second color. The display element 203 of subpixel SP3 is configured to emit light in a blue wavelength range as the third color.

It should be noted that the layout of subpixels SP1, SP2 and SP3 is not limited to the example of FIG. 2.

Figure 3:
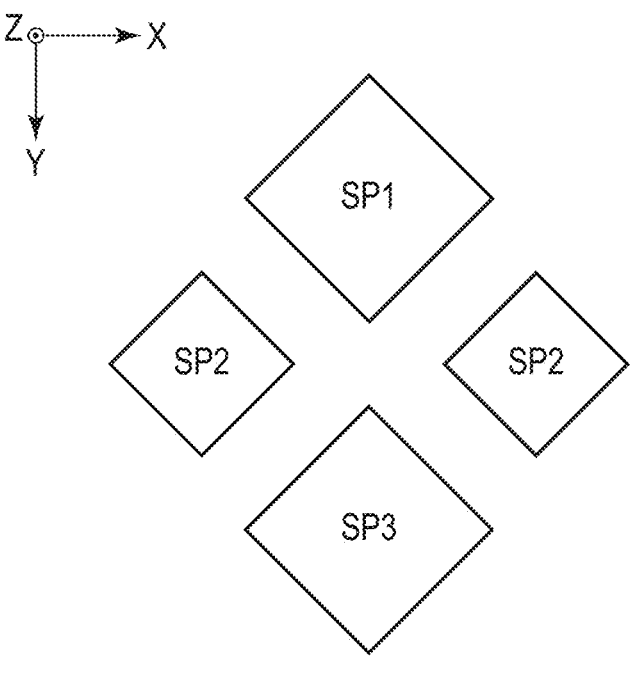
FIG. 3 is a diagram showing another example of the layout of subpixels SP1, SP2 and SP3.

In the example shown in FIG. 3, a plurality of subpixels SP2 are arranged in the first direction X, and subpixels SP1 and SP3 are alternately arranged in the second direction Y (PenTile arrangement).

Figure 4:
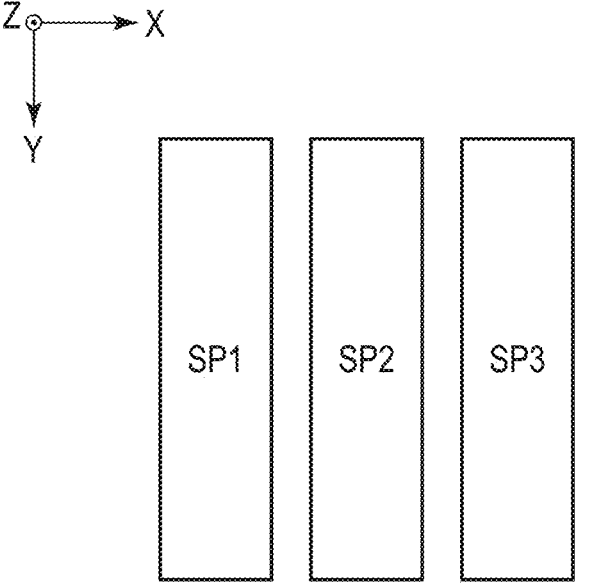
FIG. 4 is a diagram showing another example of the layout of subpixels SP1, SP2 and SP3.

In the example shown in FIG. 4, subpixels SP1, SP2 and SP3 are arranged in the first direction X and extend in the second direction (stripe arrangement).

For example, subpixel SP1 is a red pixel, and subpixel SP2 is a green pixel, and subpixel SP3 is a blue pixel.

Configuration Example 1

FIG. 5 is a plan view showing configuration example 1. In FIG. 5, the illustration of the upper electrode is omitted. FIG. 5 shows an example in which the layout shown in FIG. 2 is applied as the layout of subpixels SP1, SP2 and SP3. However, other layouts such as FIG. 3 and FIG. 4 may be applied.

At least one of the lower electrodes LE1, LE2 and LE3 shown by dotted lines comprises a flat portion and an inclined portion. In the example shown in the figure, the lower electrode LE1 comprises a flat portion FP1 and an inclined portion IP1 in the aperture AP1. The lower electrode LE2 comprises a flat portion FP2 and an inclined portion IP2 in the aperture AP2. The lower electrode LE3 comprises a flat portion FP3 and an inclined portion IP3 in the aperture AP3.

Each of the inclined portions IP1, IP2 and IP3 is formed into a circular shape in plan view. It should be noted that each of them may have another shape such as an elliptic shape or a polygonal shape. In the example shown in the figure, a single inclined portion IP1, a single inclined portion IP2 and a single inclined portion IP3 are provided. It should be noted that a plurality of inclined portions IP1, a plurality of inclined portions IP2 and a plurality of inclined portions IP3 may be provided.

The insulating layers which are the bases of the lower electrodes LE1, LE2 and LE3 comprise protrusions PT1, PT2 and PT3 shown by alternate long and short dash lines. In the lower electrode LE1, the portion which is stacked in the protrusion PT1 forms the inclined portion IP1. In the lower electrode LE2, the portion which is stacked in the protrusion PT2 forms the inclined portion IP2. In the lower electrode LE3, the portion which is stacked in the protrusion PT3 forms the inclined portion IP3. Each of the inclined portions IP1, IP2 and IP3 is spaced apart from the rib 5 in plan view and is formed into an island-like shape.

The ratio between the area of a single aperture formed in the rib 5 and the total area of the inclined portion located in the aperture is defined as an inclination ratio. When a plurality of inclined portions are provided in a single aperture, the total area of the inclined portion corresponds to the sum of the areas of all of the inclined portions.

In subpixel SP1, when the area of the aperture AP1 is defined as SA1, and the total area of the inclined portion IP1 located in the aperture AP1 is defined as SI1, inclination ratio R1 of the lower electrode LE1 is defined as SI1/SA1.

In subpixel SP2, when the area of the aperture AP2 is defined as SA2, and the total area of the inclined portion IP2 located in the aperture AP2 is defined as SI2, inclination ratio R2 of the lower electrode LE2 is defined as SI2/SA2.

In subpixel SP3, when the area of the aperture AP3 is defined as SA3, and the total area of the inclined portion IP3 located in the aperture AP3 is defined as SI3, inclination ratio R3 of the lower electrode LE3 is defined as SI3/SA3.

Inclination ratios R1, R2 and R3 can be optimized by adjusting the numbers, sizes, shapes, etc., of the inclined portions IP1, IP2 and IP3.

Now, the cross-sectional structure of the display element 201 is explained. It should be noted that, as the cross-sectional structure of each of the display elements 202 and 203 is substantially the same as that of the display element 201, explanation thereof is omitted.

FIG. 6A is a cross-sectional view of the display element 201 along the A-B line of FIG. 5.

FIG. 6B is another cross-sectional view of the display element 201 along the A-B line of FIG. 5.

A circuit layer 11 is provided on the substrate 10. The circuit layer 11 includes various circuits such as the pixel circuit 1 shown in FIG. 1 and various lines such as the scanning line GL, the signal line SL and the power line PL. The circuit layer 11 is covered with an insulating layer 12. The insulating layer 12 is an organic insulating layer which planarizes the irregularities formed by the circuit layer 11. For example, the surface of the insulating layer 12 is substantially parallel to the X-Y plane.

The protrusion PT1 is located on the insulating layer 12. The protrusion PT1 is formed of an organic insulating material such as polyimide.

In the example shown in FIG. 6A, the protrusion PT1 is formed so as to comprise substantially a semicircular section. The surface of the protrusion PT1 is formed as a curved surface. In other words, in the example shown in FIG. 5 and FIG. 6A, the protrusion PT1 is formed into a hemispherical shape.

In the modified example shown in FIG. 6B, the protrusion PT1 is formed so as to comprise substantially a trapezoidal section in which the corners are round. The upper and side surfaces of the protrusion PT1 are connected by curved surfaces and do not form a sharp edge. In other words, in the example shown in FIG. 5 and FIG. 6B, the protrusion PT1 is formed into the shape of a circular truncated cone.

It should be noted that the shape of the section of the protrusion PT1 is not limited to the semicircular shape or substantially the trapezoidal shape in which the corners are round as shown in the figures. For example, the shape of the section may be a semielliptical shape. The protrusion PT1 may be formed of the same material as the insulating layer 12 and may be formed integrally with the insulating layer 12.

The lower electrode LE1 is provided on the insulating layer 12, overlaps the protrusion PT1 and comprises the flat portion FP1 and the inclined portion IP1. The flat portion FP1 is stacked in the insulating layer 12 and is substantially parallel to the X-Y plane. The inclined portion IP1 is stacked in the protrusion PT1 and inclines relative to the flat portion FP1. Of the lower electrode LE1, the portion which protrudes in a third direction Z relative to the flat portion FP1 can be regarded as the inclined portion IP1.

The rib 5 is provided on the insulating layer 12 and the lower electrode LE1. An end portion of the lower electrode LE1 is covered with the rib 5. For example, the rib 5 is an organic insulating layer. However, the rib 5 may be an inorganic insulating layer.

The organic layer OR1 is in contact with the lower electrode LE1 through the aperture AP1, covers the lower electrode LE1 and overlaps the rib 5. The upper electrode UE faces the lower electrode LE1 and is provided on the organic layer OR1. Further, the upper electrode UE overlaps the rib 5 outside the organic layer OR1.

The lower electrode LE1 is formed of, for example, a stacked layer body of a metal layer (reflecting electrode) formed of silver (Ag), etc., and a transparent conductive layer formed of indium zinc oxide (IZO), indium tin oxide (ITO), etc. However, the lower electrode LE1 may be formed of a single-layer body of a metal layer or a transparent conductive layer. The upper electrode UE is formed of, for example, a metal material such as an alloy of magnesium and silver (MgAg).

The display element 201 shown in the figure is sealed with the sealing layer described later. It should be noted that an optical adjustment layer for adjusting the optical property of the light emitted from the organic layer OR1 may be provided on the upper electrode UE.

For reference, a case where the protrusion PT1 is formed of an inorganic insulating material is explained. In this case, the protrusion PT1 is formed so as to comprise a trapezoidal section. Near the edge in which the upper and side surfaces of the protrusion PT1 intersect each other, each of the lower electrode LE1, the organic layer OR1 and the upper electrode UE easily becomes thin. For example, when the organic layer OR1 overlapping the vicinity of the edge becomes thin locally or is broken, the reduction in the display quality such as off-leak or non-uniformity in light emission may be caused.

In the present embodiment, the protrusion PT1 is formed of an organic insulating material. As shown in FIG. 6A, when the protrusion PT1 is formed so as to comprise a semicircular section, its surface is formed as a smooth curved surface. As shown in FIG. 6B, when the protrusion PT1 is formed so as to comprise substantially a trapezoidal section in which the corners are round, smooth curved surfaces are formed between the upper and side surfaces of the protrusion PT1 (in other words, the protrusion PT1 does not comprise a sharp edge). Thus, a gentle inclined portion IP1 is formed in the lower electrode LE1 overlapping the protrusion PT1. Regarding each of the organic layer OR1 overlapping the lower electrode LE1 and the upper electrode UE1 overlapping the organic layer OR1, problems in which they become thin locally or are broken are prevented.

Each of the display elements 201 to 203 is optimized such that the peak wavelength of the light emitted from the organic layer corresponds to an effective optical path length, and is configured to improve the luminous efficiency by a microcavity effect. However, when the position for observing each display element is changed, the optical path length is changed, and further, the effect of reflection on the interface between thin films having different refractive indices becomes large, and thus, the luminance is changed. To prevent this change in luminance depending on the position of observation, the application of the lower electrode comprising the inclined portion is effective.

Figure 7:
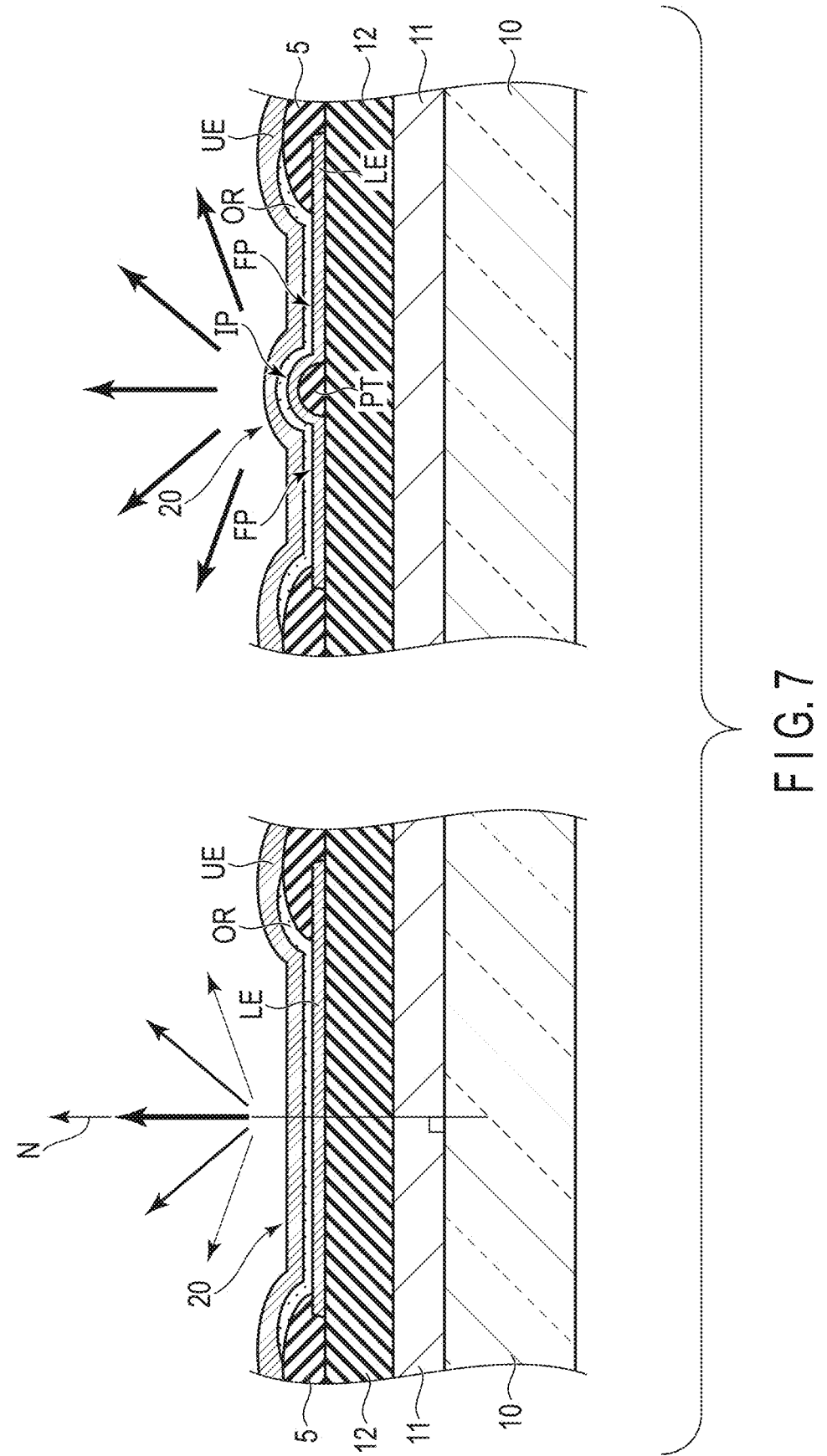
FIG. 7 is a diagram for explaining an effect which is obtained when a lower electrode LE comprises an inclined portion IP.

FIG. 7 is a diagram for explaining an effect which is obtained when a lower electrode LE comprises an inclined portion IP.

The left side of FIG. 7 shows a section of the display element 20 of a comparative example in which the lower electrode LE does not comprise the inclined portion IP. The comparative example is optimized assuming a case where the display element 20 is observed in a direction along the normal N of the substrate 10. In this case, although a high luminance is obtained at a position along the normal N, the luminance gradually decreases with increasing inclination relative to the normal N.

The right side of FIG. 7 shows a section of the display element 20 of the present embodiment in which the lower electrode LE comprises the inclined portion IP. The present embodiment allows optimization such that a microcavity effect can be obtained in the area overlapping the inclined portion IP of the lower electrode LE. Thus, the difference between the luminance which is obtained at a position along the normal N and the luminance which is obtained at a position inclining relative to the normal N is reduced compared to the comparative example. In other words, the change in luminance depending on the position of observation is prevented.

Figure 8:
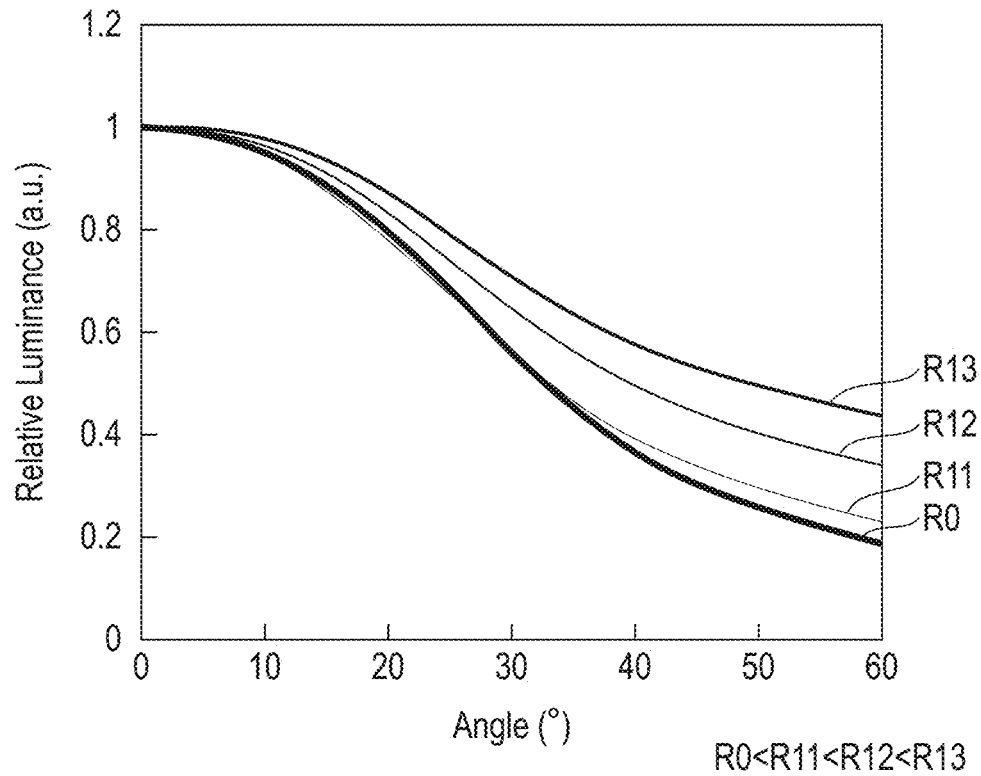
FIG. 8 is a diagram for explaining viewing angle characteristics showing the relationship between the position of observation and luminance.

FIG. 8 is a diagram for explaining viewing angle characteristics showing the relationship between the position of observation and luminance.

The horizontal axis indicates the inclination) (°) relative to the normal N. The vertical axis indicates the relative luminance when the luminance at a position along the normal N is 1.

In the figure, R0 is an inclination ratio when the lower electrode does not comprise an inclined portion. In the figure, R11, R12 and R13 are inclination ratios when the lower electrodes comprise respective inclined portions, and the relationship of the ratios is as follows.

$$R0 < R11 < R12 < R13$$

In all of the cases, although the luminance tends to decrease with increasing inclination, the luminance in an oblique direction (a direction in which the inclination is 40° to 60°) increases as the inclination ratio increases. Thus, it is confirmed that the viewing angle characteristics of luminance can be improved by increasing the inclination ratio.

In configuration example 1, each of the inclined portions IP1, IP2 and IP3 is formed into a semicircular shape. Therefore, in both a case where the position of observation is changed in the first direction X relative to the normal N of the substrate 10 and a case where the position of observation is changed in the second direction Y, the viewing angle characteristics of luminance can be improved.

Some embodiments are explained below. In the drawings for explaining the embodiments, the illustration of the upper electrode is omitted. In addition, the drawings show an example in which the layout shown in FIG. 2 is applied as the layout of subpixels SP1, SP2 and SP3. However, other layouts such as FIG. 3 and FIG. 4 may be applied.

Embodiment 1

Figure 9:
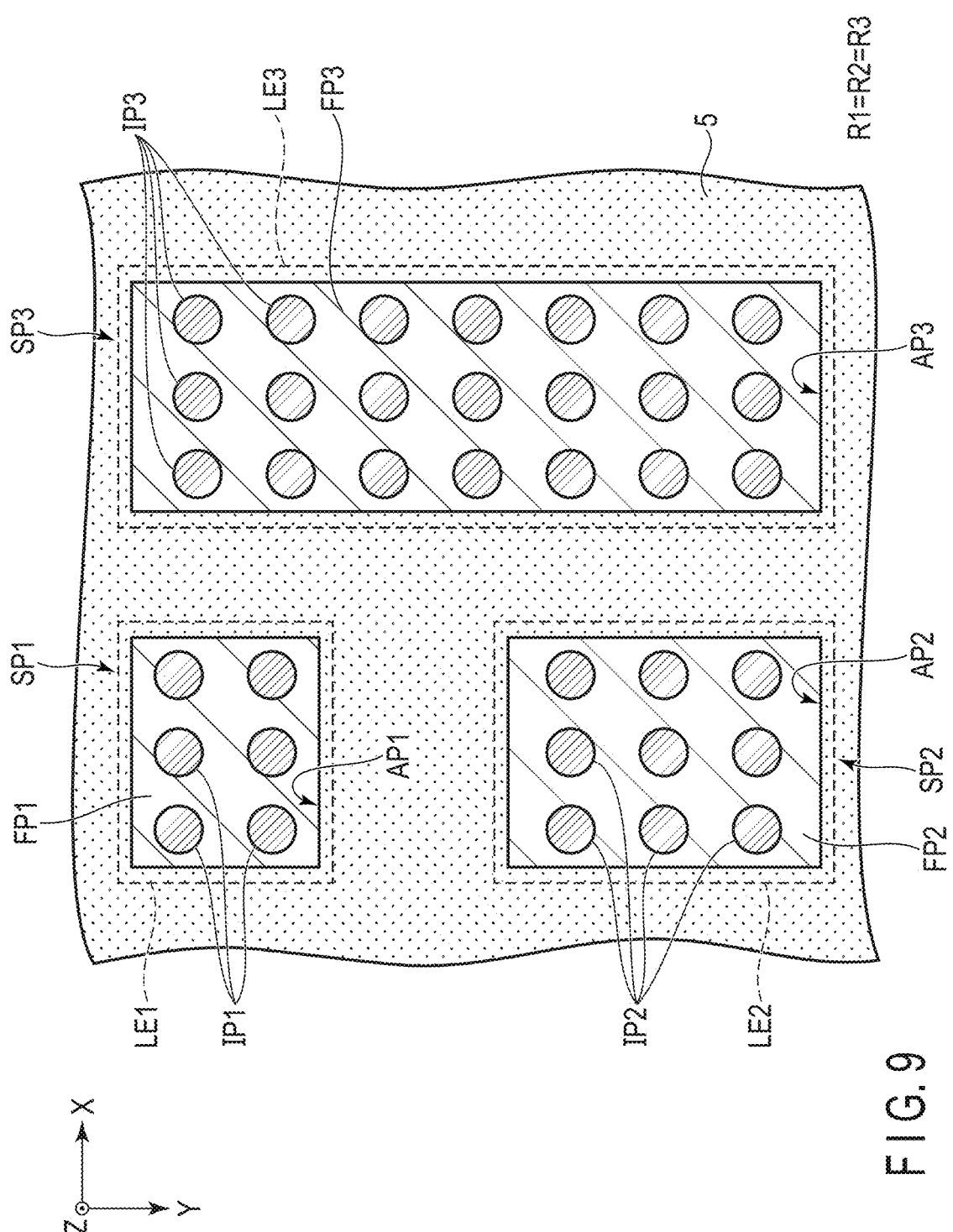
FIG. 9 is a plan view for explaining embodiment 1.

FIG. 9 is a plan view for explaining embodiment 1.

Embodiment 1 corresponds to a case where inclination ratio R1 of a lower electrode LE1, inclination ratio R2 of a lower electrode LE2 and inclination ratio R3 of a lower electrode LE3 are equal to each other (R1=R2=R3).

The lower electrode LE1 comprises a flat portion FP1 and a plurality of inclined portions IP1 in an aperture AP1. Each of the inclined portions IP1 is formed into a circular shape. The inclined portions IP1 are arrayed in matrix in a first direction X and a second direction Y.

The lower electrode LE2 comprises a flat portion FP2 and a plurality of inclined portions IP2 in an aperture AP2. Each of the inclined portions IP2 is formed into a circular shape. The inclined portions IP2 are arrayed in matrix in the first direction X and the second direction Y. The area of the aperture AP2 is greater than that of the aperture AP1. The number of inclined portions IP2 is different from that of inclined portions IP1. In the example shown in the figure, the number of inclined portions IP2 is greater than that of inclined portions IP1.

The lower electrode LE3 comprises a flat portion FP3 and a plurality of inclined portions IP3 in an aperture AP3. Each of the inclined portions IP3 is formed into a circular shape. The inclined portions IP3 are arrayed in matrix in the first direction X and the second direction Y. The area of the aperture AP3 is greater than that of the aperture AP2. The number of inclined portions IP3 is greater than that of inclined portions IP2.

The total area of the inclined portions IP1, the total area of the inclined portions IP2 and the total area of the inclined portions IP3 are set so as to satisfy the relationship "R1=R2=R3" of the inclination ratios.

It should be noted that the number, size, shape or arrangement pattern of the inclined portions IP1, IP2 or IP3 is not limited to the example shown in the figure.

Figure 10:
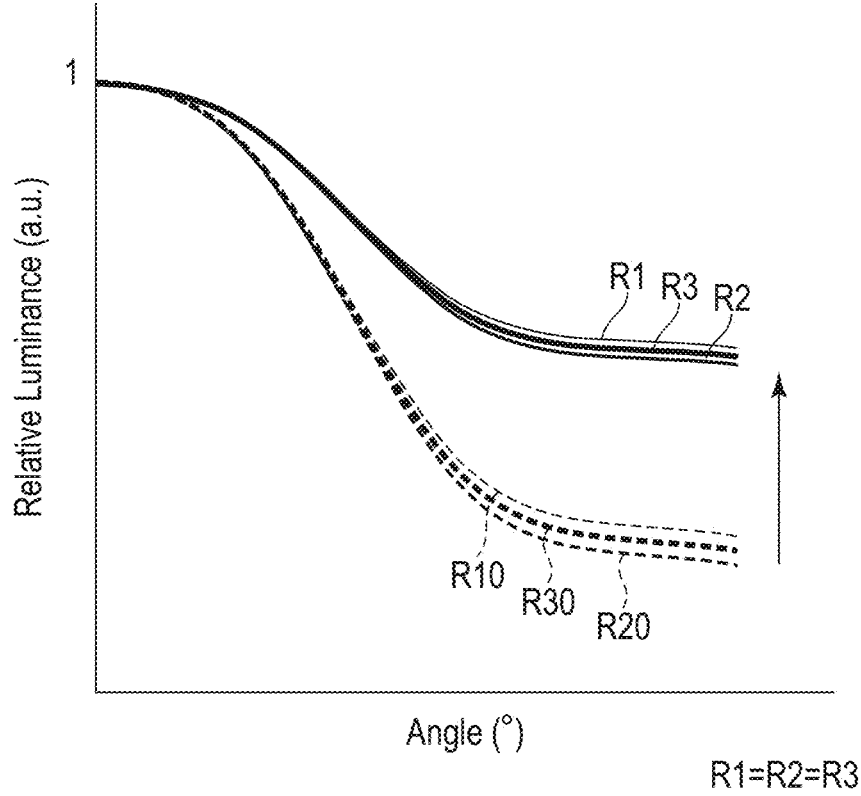
FIG. 10 is a diagram for explaining viewing angle characteristics in embodiment 1.

FIG. 10 is a diagram for explaining viewing angle characteristics in embodiment 1.

The horizontal axis indicates the inclination (°) relative to the normal. The vertical axis indicates the relative luminance when the luminance at a position along the normal is 1.

In the figure, R10 is an inclination ratio when the lower electrode LE1 does not comprise an inclined portion.

In the figure, R20 is an inclination ratio when the lower electrode LE2 does not comprise an inclined portion.

In the figure, R30 is an inclination ratio when the lower electrode LE3 does not comprise an inclined portion.

In the figure, R1 is an inclination ratio when the lower electrode LE1 comprises the inclined portions IP1 shown in FIG. 9 (R10<R1). The viewing angle characteristics of inclination ratio R1 is improved compared to those of inclination ratio R10 (the luminance in an oblique direction is increased).

In the figure, R2 is an inclination ratio when the lower electrode LE2 comprises the inclined portions IP2 shown in FIG. 9 (R20<R2). The viewing angle characteristics of inclination ratio R2 is improved compared to those of inclination ratio R20.

In the figure, R3 is an inclination ratio when the lower electrode LE3 comprises the inclined portions IP3 shown in FIG. 9 (R30<R3). The viewing angle characteristics of inclination ratio R3 is improved compared to those of inclination ratio R30.

In this manner, the viewing angle characteristics of luminance can be uniformly improved in embodiment 1 compared to a case where no inclined portion is provided in subpixel SP1, SP2 or SP3.

Embodiment 2

FIG. 11 is a plan view for explaining embodiment 2.

Embodiment 2 corresponds to a case where inclination ratio R2 of a lower electrode LE2 is greater than inclination ratio R1 of a lower electrode LE1, and inclination ratio R3 of a lower electrode LE3 is equal to inclination ratio R2 or greater than inclination ratio R2 (R1<R2≤R3).

The lower electrode LE1 comprises a flat portion FP1 and does not comprise an inclined portion in an aperture AP1. However, the lower electrode LE1 may comprise some inclined portions in a range which satisfies the relationship "R1<R2" of the inclination ratios.

The lower electrode LE2 comprises a flat portion FP2 and a plurality of inclined portions IP2 in an aperture AP2. Each of the inclined portions IP2 is formed into a circular shape. The inclined portions IP2 are arrayed in matrix in a first direction X and a second direction Y. The area of the aperture AP2 is greater than that of the aperture AP1.

The lower electrode LE3 comprises a flat portion FP3 and a plurality of inclined portions IP3 in an aperture AP3. Each of the inclined portions IP3 is formed into a circular shape. The inclined portions IP3 are arrayed in matrix in the first direction X and the second direction Y. The area of the aperture AP3 is greater than that of the aperture AP2. The number of inclined portions IP3 is greater than that of inclined portions IP2.

The total area of the inclined portions IP2 and the total area of the inclined portions IP3 are set so as to satisfy the relationship "R2 R3" of the inclination ratios.

It should be noted that the number, size, shape or arrangement pattern of the inclined portions IP2 or IP3 is not limited to the example shown in the figure.

FIG. 12 is a diagram for explaining viewing angle characteristics in embodiment 2.

The horizontal axis indicates the inclination) (°) relative to the normal. The vertical axis indicates the relative luminance when the luminance at a position along the normal is 1.

In the figure, R20 is an inclination ratio when the lower electrode LE2 does not comprise an inclined portion.

In the figure, R30 is an inclination ratio when the lower electrode LE3 does not comprise an inclined portion.

In the figure, R1 is the inclination ratio of the lower electrode LE1 shown in FIG. 11.

In the figure, R2 is an inclination ratio when the lower electrode LE2 comprises the inclined portions IP2 shown in FIG. 11 (R20<R2). The viewing angle characteristics of inclination ratio R2 is improved compared to those of inclination ratio R20.

In the figure, R3 is an inclination ratio when the lower electrode LE3 comprises the inclined portions IP3 shown in FIG. 11 (R30<R3). The viewing angle characteristics of inclination ratio R3 is improved compared to those of inclination ratio R30.

As described above, the viewing angle characteristics of luminance can be improved in embodiment 2 compared to a case where no inclined portion is provided in subpixel SP2 or SP3.

For example, subpixel SP1 is a red pixel, and subpixel SP2 is a green pixel, and subpixel SP3 is a blue pixel. According to embodiment 2, the viewing angle character-istics of luminance can be improved in green and blue pixels.

Embodiment 2 is explained regarding the example in which inclined portions are provided in each of green and blue pixels without providing an inclined portion in a red pixel. However, the configuration is not limited to this example. Specifically, inclined portions may be provided in each of red and green pixels without providing an inclined portion in a blue pixel. Alternatively, inclined portions may be provided in each of red and blue pixels without providing an inclined portion in a green pixel. Each subpixel in which inclined portions are provided is appropriately selected from red, green and blue pixels in accordance with the required specification and the characteristics of light emission colors.

Embodiment 3

Figure 13:
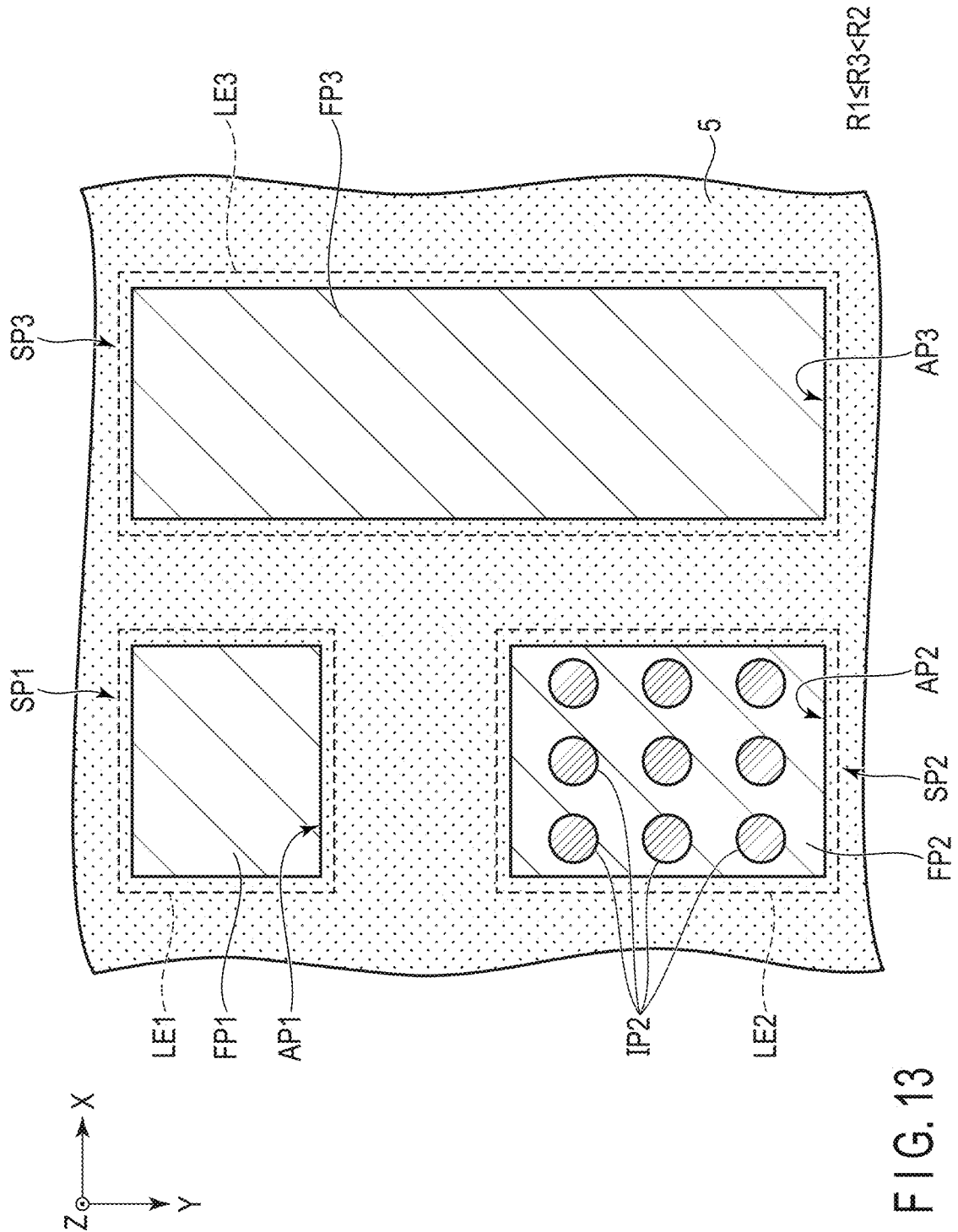
FIG. 13 is a plan view for explaining embodiment 3.

FIG. 13 is a plan view for explaining embodiment 3.

Embodiment 3 corresponds to a case where inclination ratio R3 of a lower electrode LE3 is equal to inclination ratio R1 of a lower electrode LE1 or greater than inclination ratio R1, and inclination ratio R2 of a lower electrode LE2 is greater than inclination ratio R3 (R1≤R3<R2).

The lower electrode LE1 comprises a flat portion FP1 and does not comprise an inclined portion in an aperture AP1.

The lower electrode LE2 comprises a flat portion FP2 and a plurality of inclined portions IP2 in an aperture AP2. Each of the inclined portions IP2 is formed into a circular shape. The inclined portions IP2 are arrayed in matrix in a first direction X and a second direction Y.

The lower electrode LE3 comprises a flat portion FP3 and does not comprise an inclined portion in an aperture AP3. However, each of the lower electrodes LE1 and LE3 may comprise some inclined portions in a range which satisfies the relationship "R1≤R3" of the inclination ratios.

The total area of the inclined portions IP2 is set so as to satisfy the relationship "R3<R2" of the inclination ratios.

It should be noted that the number, size, shape or arrange-ment pattern of the inclined portions IP2 is not limited to the example shown in the figure.

FIG. 14 is a diagram for explaining viewing angle char-acteristics in embodiment 3.

The horizontal axis indicates the inclination) (°) relative to the normal. The vertical axis indicates the relative lumi-nance when the luminance at a position along the normal is 1.

In the figure, R20 is an inclination ratio when the lower electrode LE2 does not comprise an inclined portion.

In the figure, R1 is the inclination ratio of the lower electrode LE1 shown in FIG. 13.

In the figure, R2 is an inclination ratio when the lower electrode LE2 comprises the inclined portions IP2 shown in FIG. 13 (R20<R2). The viewing angle characteristics of inclination ratio R2 is improved compared to those of inclination ratio R20.

In the figure, R3 is the inclination ratio of the lower electrode LE3 shown in FIG. 13.

As described above, the viewing angle characteristics of luminance can be improved in embodiment 3 compared to a case where no inclined portion is provided in subpixel SP2.

For example, subpixel SP1 is a red pixel, and subpixel SP2 is a green pixel, and subpixel SP3 is a blue pixel. According to embodiment 3, the viewing angle character-istics of luminance can be improved in a green pixel.

Embodiment 3 is explained regarding the example in which inclined portions are provided in a green pixel with-out providing an inclined portion in a red pixel or a blue pixel. However, the configuration is not limited to this example. Specifically, inclined portions may be provided in a red pixel without providing an inclined portion in a blue pixel or a green pixel. Alternatively, inclined portions may be provided in a blue pixel without providing an inclined portion in a red pixel or a green pixel.

Embodiment 4

FIG. 15 is a plan view for explaining embodiment 4.

Embodiment 4 corresponds to a case where inclination ratio R2 of a lower electrode LE2 is equal to inclination ratio R1 of a lower electrode LE1 or greater than inclination ratio R1, and inclination angle R3 of a lower electrode LE3 is greater than inclination ratio R2 (R1≤R2<R3).

The lower electrode LE1 comprises a flat portion FP1 and does not comprise an inclined portion in an aperture AP1.

The lower electrode LE2 comprises a flat portion FP2 and does not comprise an inclined portion in an aperture AP2. However, each of the lower electrodes LE1 and LE2 may comprise some inclined portions in a range which satisfies the relationship "R1≤R2" of the inclination ratios.

The lower electrode LE3 comprises a flat portion FP3 and a plurality of inclined portions IP3 in an aperture AP3. Each of the inclined portions IP3 is formed into a circular shape. The inclined portions IP3 are arrayed in matrix in a first direction X and a second direction Y.

The total area of the inclined portions IP3 is set so as to satisfy the relationship "R2<R3" of the inclination ratios.

It should be noted that the number, size, shape or arrange-ment pattern of the inclined portions IP3 is not limited to the example shown in the figure.

FIG. 16 is a diagram for explaining viewing angle char-acteristics in embodiment 4.

The horizontal axis indicates the inclination) (°) relative to the normal. The vertical axis indicates the relative lumi-nance when the luminance at a position along the normal is 1.

In the figure, R30 is an inclination ratio when the lower electrode LE3 does not comprise an inclined portion.

In the figure, R1 is the inclination ratio of the lower electrode LE1 shown in FIG. 15.

In the figure, R2 is the inclination ratio of the lower electrode LE2 shown in FIG. 15.

In the figure, R3 is an inclination ratio when the lower electrode LE3 comprises the inclined portions IP3 shown in FIG. 15 (R30<R3). The viewing angle characteristics of inclination ratio R3 is improved compared to those of inclination ratio R30.

As described above, the viewing angle characteristics of luminance can be improved in embodiment 4 compared to a case where no inclined portion is provided in subpixel SP3.

In the example shown in the figure, when the viewing angle characteristics are compared with each other regarding the cases where no inclined portion is provided in subpixels SP1, SP2 and SP3 (regarding the cases of inclination ratios R1, R2 and R30), the viewing angle characteristics in subpixel SP3 are degraded relative to those of subpixels SP1 and SP2. In this case, by providing inclined portions IP3 in the lower electrode LE3 of subpixel SP3, the viewing angle characteristics of subpixel SP3 are improved, and viewing angle characteristics equivalent to those of subpixels SP1 and SP2 can be obtained.

Embodiment 4 is explained regarding the example in which inclined portions are provided in a blue pixel without providing an inclined portion in a red pixel or a green pixel. However, the configuration is not limited to this example. Specifically, when the viewing angle characteristics of a red pixel are degraded relative to those of blue and green pixels, inclined portions may be provided in a red pixel without providing an inclined portion in a blue pixel or a green pixel. Similarly, when the viewing angle characteristics of a green pixel are degraded relative to those of blue and red pixels, inclined portions may be provided in a green pixel without providing an inclined portion in a blue pixel or a red pixel.

Now, configuration example 2 is explained. It should be noted that the explanation of the same elements as configuration example 1 may be omitted or simplified by adding the same reference numbers.

Configuration Example 2

FIG. 17 is a plan view showing configuration example 2. In FIG. 17, the illustration of the upper electrode is omitted. FIG. 17 shows an example in which the layout shown in FIG. 2 is applied as the layout of subpixels SP1, SP2 and SP3. However, other layouts such as FIG. 3 and FIG. 4 may be applied.

At least one of the lower electrodes LE1, LE2 and LE3 shown by dotted lines comprises a flat portion and an inclined portion.

In the example shown in the figure, the lower electrode LE1 comprises the flat portion FP1 and the inclined portion IP1 in the aperture AP1. The inclined portion IP1 is provided along the edge E1 of the aperture AP1.

The lower electrode LE2 comprises the flat portion FP2 and the inclined portion IP2 in the aperture AP2. The inclined portion IP2 is provided along the edge E2 of the aperture AP2.

The lower electrode LE3 comprises the flat portion FP3 and the inclined portion IP3 in the aperture AP3. The inclined portion IP3 is provided along the edge E3 of the aperture AP3.

The insulating layers which are the bases of the lower electrodes LE1, LE2 and LE3 comprise the protrusions PT1, PT2 and PT3 shown by alternate long and short dash lines. The protrusions PT1, PT2 and PT3 may be connected to each other.

In the lower electrode LE1, of the portion stacked in the protrusion PT1, the portion located in the aperture AP1 forms the inclined portion IP1. The inclined portion IP1 is provided along the whole circumference of the edge E1, is formed into a frame-like shape and is in contact with the rib 5 in plan view. The flat portion FP1 is surrounded by the inclined portion IP1 and is spaced apart from the rib 5 in plan view.

In the lower electrode LE2, of the portion stacked in the protrusion PT2, the portion located in the aperture AP2 forms the inclined portion IP2. The inclined portion IP2 is provided along the whole circumference of the edge E2, is formed into a frame-like shape and is in contact with the rib 5 in plan view. The flat portion FP2 is surrounded by the inclined portion IP2 and is spaced apart from the rib 5 in plan view.

In the lower electrode LE3, of the portion stacked in the protrusion PT3, the portion located in the aperture AP3 forms the inclined portion IP3. The inclined portion IP3 is provided along the whole circumference of the edge E3, is formed into a frame-like shape and is in contact with the rib 5 in plan view. The flat portion FP3 is surrounded by the inclined portion IP3 and is spaced apart from the rib 5 in plan view.

The length of the inclined portion IP1, the length of the inclined portion IP2 and the length of the inclined portion IP3 are different from each other. Here, the length of each inclined portion corresponds to the sum of the lengths parallel to the first direction X and the lengths parallel to the second direction Y. The length of the inclined portion IP2 is greater than that of the inclined portion IP1. The length of the inclined portion IP3 is greater than that of the inclined portion IP2.

The definition of the inclination ratios in this configuration example 2 is the same as that of the inclination ratios explained in configuration example 1.

In subpixel SP1, when the area of the aperture AP1 is defined as SA1, and the total area of the inclined portion IP1 located in the aperture AP1 is defined as SI1, inclination ratio R1 of the lower electrode LE1 is defined as SI1/SA1.

In subpixel SP2, when the area of the aperture AP2 is defined as SA2, and the total area of the inclined portion IP2 located in the aperture AP2 is defined as SI2, inclination ratio R2 of the lower electrode LE2 is defined as SI2/SA2.

In subpixel SP3, when the area of the aperture AP3 is defined as SA3, and the total area of the inclined portion IP3 located in the aperture AP3 is defined as SI3, inclination ratio R3 of the lower electrode LE3 is defined as SI3/SA3.

Inclination ratios R1, R2 and R3 can be optimized by adjusting the lengths, widths, shapes, etc., of the inclined portions IP1, IP2 and IP3.

Now, the cross-sectional structure of the display element 201 is explained. It should be noted that, as the cross-sectional structure of each of the display elements 202 and 203 is substantially the same as that of the display element 201, explanation thereof is omitted.

Figure 18A:
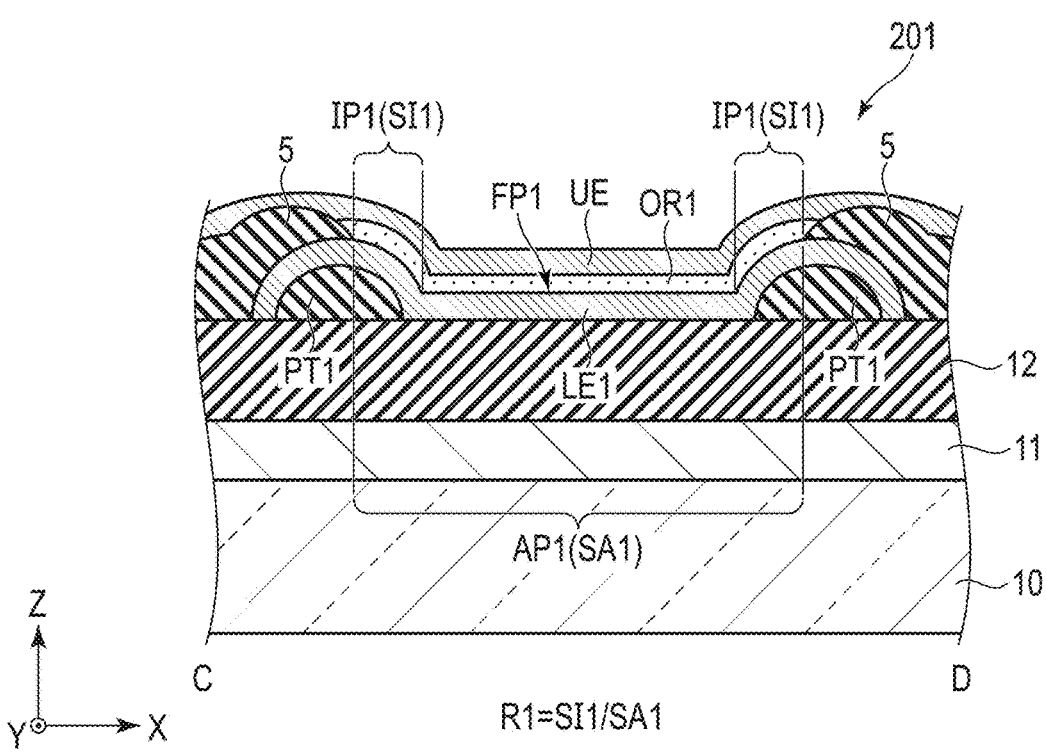
FIG. 18A is a cross-sectional view of the display element 201 along the C-D line of FIG. 17.

FIG. 18A is a cross-sectional view of the display element 201 along the C-D line of FIG. 17.

Figure 18B:
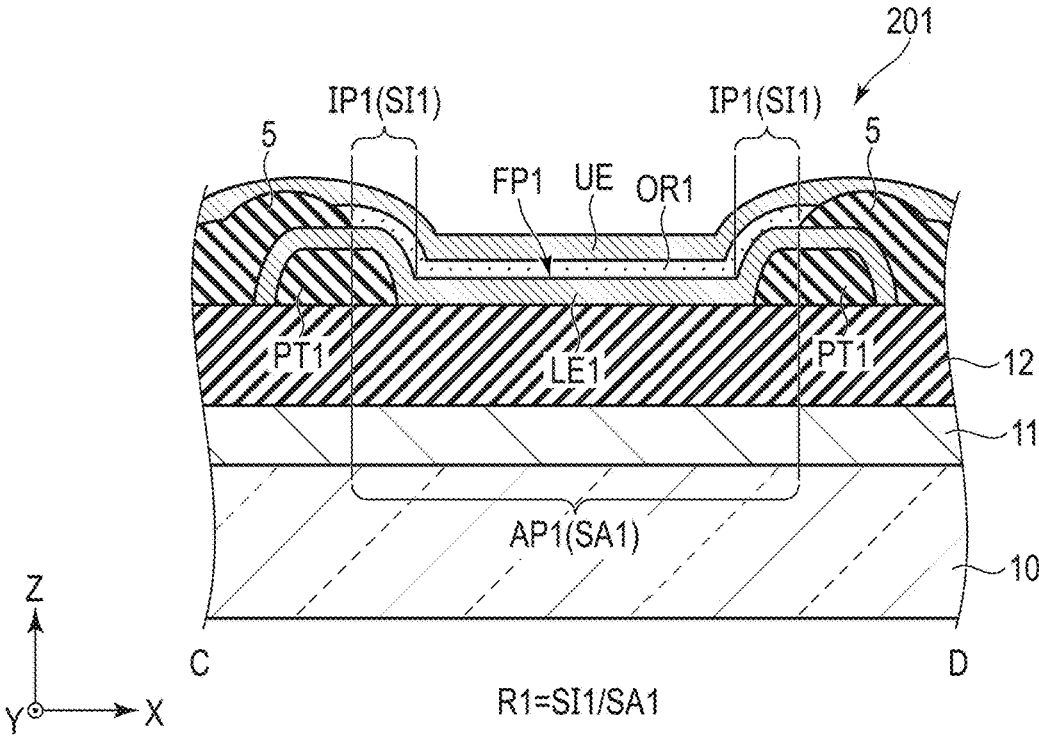
FIG. 18B is another cross-sectional view of the display element 201 along the C-D line of FIG. 17.

FIG. 18B is another cross-sectional view of the display element 201 along the C-D line of FIG. 17.

The circuit layer 11 is provided on the substrate 10 and is covered with the insulating layer 12. The insulating layer 12 is an organic insulating layer. For example, the surface of the insulating layer 12 is substantially parallel to the X-Y plane.

The protrusion PT1 is located on the insulating layer 12. The protrusion PT1 is formed of an organic insulating material.

In the example shown in FIG. 18A, the protrusion PT1 is formed so as to comprise substantially a semicircular section. The surface of the protrusion PT1 is formed as a curved surface. In the modified example shown in FIG. 18B, the protrusion PT1 is formed so as to comprise substantially a trapezoidal section in which the corners are round. The upper and side surfaces of the protrusion PT1 are connected by curved surfaces and do not form a sharp edge.

It should be noted that the shape of the section of the protrusion PT1 is not limited to the semicircular shape or substantially the trapezoidal shape in which the corners are round as shown in the figures. For example, the shape of the section may be a semielliptical shape. The protrusion PT1 may be formed of the same material as the insulating layer 12 and may be formed integrally with the insulating layer 12.

The lower electrode LE1 is provided on the insulating layer 12, overlaps the protrusion PT1 and comprises the flat portion FP1 and the inclined portion IP1. The rib 5 is provided on the insulating layer 12 and the lower electrode LE1 and overlaps part of the protrusion PT1. An end portion of the lower electrode LE1 is located on the protrusion PT1 and is covered with the rib 5.

In the lower electrode LE1, the flat portion FP1 is stacked in the insulating layer 12 and is substantially parallel to the X-Y plane. The inclined portion IP1 is stacked in the protrusion PT1 and inclines relative to the flat portion FP1. Of the lower electrode LE1, the portion which protrudes in the third direction Z relative to the flat portion FP1 can be regarded as the inclined portion IP1 in the aperture AP1. For example, the width of the inclined portion IP1 in the first direction X in the aperture AP1 is approximately half the width of the protrusion PT1 in the first direction X.

The organic layer OR1 is in contact with the lower electrode LE1 through the aperture AP1, covers the lower electrode LE1 and overlaps the rib 5. The upper electrode UE faces the lower electrode LE1 and is provided on the organic layer OR1. Further, the upper electrode UE overlaps the rib 5 outside the organic layer OR1.

In this configuration example 2, effects similar to those explained in configuration example 1 are obtained.

In configuration example 2, each of the inclined portions IP1, IP2 and IP3 is formed into a frame-like shape. Therefore, in both a case where the position of observation is changed in the first direction X relative to the normal N of the substrate 10 and a case where the position of observation is changed in the second direction Y, the viewing angle characteristics of luminance can be improved.

In configuration example 2, similarly, embodiment 1 to embodiment 4 described above can be applied.

In embodiment 1, inclination ratio R1 of the lower electrode LE1, inclination ratio R2 of the lower electrode LE2 and inclination ratio R3 of the lower electrode LE3 are equal to each other (R1=R2=R3).

The lower electrode LE1 comprises the flat portion FP1 and the inclined portions IP1 in the aperture AP1.

The lower electrode LE2 comprises the flat portion FP2 and the inclined portions IP2 in the aperture AP2. The area of the aperture AP2 is greater than that of the aperture AP1. The total area of the inclined portions IP2 is greater than that of the inclined portions IP1.

The lower electrode LE3 comprises the flat portion FP3 and the inclined portions IP3 in the aperture AP3. The area of the aperture AP3 is greater than that of the aperture AP2. The total area of the inclined portions IP3 is greater than that of the inclined portions IP2.

The total area of the inclined portions IP1, the total area of the inclined portions IP2 and the total area of the inclined portions IP3 are set so as to satisfy the relationship "R1=R2=R3" of the inclination ratios.

According to the above embodiment 1, the viewing angle characteristics of luminance shown in FIG. 10 are obtained.

In embodiment 2, inclination ratio R2 of the lower electrode LE2 is greater than inclination ratio R1 of the lower electrode LE1, and inclination ratio R3 of the lower electrode LE3 is equal to inclination ratio R2 or greater than inclination ratio R2 (R1<R2≤R3).

The lower electrode LE1 comprises the flat portion FP1 and does not comprise an inclined portion in the aperture AP1. However, the lower electrode LE1 may comprise an inclined portion having a small area in a range which satisfies the relationship "R1<R2" of the inclination ratios.

The lower electrode LE2 comprises the flat portion FP2 and the inclined portions IP2 in the aperture AP2.

The lower electrode LE3 comprises the flat portion FP3 and the inclined portions IP3 in the aperture AP3. The area of the aperture AP3 is greater than that of the aperture AP2. The total area of the inclined portions IP3 is greater than that of the inclined portions IP2.

The total area of the inclined portions IP2 and the total area of the inclined portions IP3 are set so as to satisfy the relationship "R2 R3" of the inclination ratios.

According to the above embodiment 2, the viewing angle characteristics of luminance shown in FIG. 12 are obtained.

In embodiment 3, inclination ratio R3 of the lower electrode LE3 is equal to inclination ratio R1 of the lower electrode LE1 or greater than inclination ratio R1, and inclination ratio R2 of the lower electrode LE2 is greater than inclination ratio R3 (R1≤R3<R2).

The lower electrode LE1 comprises the flat portion FP1 and does not comprise an inclined portion in the aperture AP1.

The lower electrode LE2 comprises the flat portion FP2 and the inclined portions IP2 in the aperture AP2.

The lower electrode LE3 comprises the flat portion FP3 and does not comprise an inclined portion in the aperture AP3. However, each of the lower electrodes LE1 and LE3 may comprise an inclined portion having a small area in a range which satisfies the relationship "R1≤R3" of the inclination ratios.

The total area of the inclined portions IP2 is set so as to satisfy the relationship "R3<R2" of the inclination ratios.

According to the above embodiment 3, the viewing angle characteristics of luminance shown in FIG. 14 are obtained.

In embodiment 4, inclination ratio R2 of the lower electrode LE2 is equal to inclination ratio R1 of the lower electrode LE1 or greater than inclination ratio R1, and inclination ratio R3 of the lower electrode LE3 is greater than inclination ratio R2 (R1≤R2<R3).

The lower electrode LE1 comprises the flat portion FP1 and does not comprise an inclined portion in the aperture AP1.

The lower electrode LE2 comprises the flat portion FP2 and does not comprise an inclined portion in the aperture AP2. However, each of the lower electrodes LE1 and LE2 may comprise an inclined portion having a small area in a range which satisfies the relationship "R1 R2" of the inclination ratios.

The lower electrode LE3 comprises the flat portion FP3 and the inclined portions IP3 in the aperture AP3.

The total area of the inclined portions IP3 is set so as to satisfy the relationship "R2<R3" of the inclination ratios.

According to the above embodiment 4, the viewing angle characteristics of luminance shown in FIG. 16 are obtained.

Now, some examples of the shapes of the inclined portions IP1, IP2 and IP3 are explained with reference to FIG. 19 to FIG. 22. In the drawings, each of the edge E1 of the aperture AP1, the edge E2 of the aperture AP2 and the edge E3 of the aperture AP3 extends in the first direction X and the second direction Y and is formed into a rectangular shape. Each of the inclined portions IP1, IP2 and IP3 extends in at least one of the first direction X and the second direction Y.

In the example shown in FIG. 19, each of the inclined portion IP1 of the lower electrode LE1, the inclined portion IP2 of the lower electrode LE2 and the inclined portion IP3 of the lower electrode LE3 is divided into a plurality of pieces and comprises portions extending in the first direction X and portions extending in the second direction Y. The portions extending in the first direction X are spaced apart from the portions extending in the second direction Y.

In this manner, each of the inclined portions IP1, IP2 and IP3 comprises the portions extending in the first direction X and the portions extending in the second direction Y. Therefore, in both a case where the position of observation is changed in the first direction X relative to the normal N of the substrate 10 and a case where the position of observation is changed in the second direction Y, the viewing angle characteristics of luminance can be improved.

In the example shown in FIG. 20, each of the inclined portion IP1 of the lower electrode LE1, the inclined portion IP2 of the lower electrode LE2 and the inclined portion IP3 of the lower electrode LE3 comprises portions extending in the first direction X and does not comprise a portion extending in the second direction Y.

In this manner, each of the inclined portions IP1, IP2 and IP3 comprises the portions extending in the first direction X. Therefore, in a case where the position of observation is changed in the second direction Y relative to the normal N of the substrate 10, the viewing angle characteristics of luminance can be improved.

In the example shown in FIG. 21, each of the inclined portion IP1 of the lower electrode LE1, the inclined portion IP2 of the lower electrode LE2 and the inclined portion IP3 of the lower electrode LE3 comprises portions extending in the second direction Y and does not comprise a portion extending in the first direction X.

In this manner, each of the inclined portions IP1, IP2 and IP3 comprises the portions extending in the second direction Y. Therefore, in a case where the position of observation is changed in the first direction X relative to the normal N of the substrate 10, the viewing angle characteristics of luminance can be improved.

In the example shown in FIG. 22, each of the inclined portion IP1 of the lower electrode LE1, the inclined portion IP2 of the lower electrode LE2 and the inclined portion IP3 of the lower electrode LE3 is divided into a plurality of pieces and comprises portions extending in the first direction X and portions extending in the second direction Y. Each of the portions extending in the first direction X is connected to the corresponding portion extending in the second direction Y.

In this manner, each of the inclined portions IP1, IP2 and IP3 comprises the portions extending in the first direction X and the portions extending in the second direction Y. Therefore, in both a case where the position of observation is changed in the first direction X relative to the normal N of the substrate 10 and a case where the position of observation is changed in the second direction Y, the viewing angle characteristics of luminance can be improved.

Now, configuration example 3 is explained. Configuration example 3 corresponds to the combination of configuration example 1 and configuration example 2 described above. It should be noted that the explanation of the same elements as configuration example 1 and configuration example 2 may be omitted or simplified by adding the same reference numbers.

Configuration Example 3

FIG. 23 is a plan view showing configuration example 3. In FIG. 23, the illustration of the upper electrode is omitted. FIG. 23 shows an example in which the layout shown in FIG. 2 is applied as the layout of subpixels SP1, SP2 and SP3. However, other layouts such as FIG. 3 and FIG. 4 may be applied.

At least one of the lower electrodes LE1, LE2 and LE3 shown by dotted lines comprises a flat portion and an inclined portion.

In the example shown in the figure, the lower electrode LE1 comprises the flat portion FP1 and the inclined portions IP1 in the aperture AP1. The inclined portions IP1 include an inclined portion IP1 having a frame-like shape and provided along the edge E1 of the aperture AP1 and an inclined portion IP1 having an island-like shape and spaced apart from the edge E1.

The lower electrode LE2 comprises the flat portion FP2 and the inclined portions IP2 in the aperture AP2. The inclined portions IP2 include an inclined portion IP2 having a frame-like shape and provided along the edge E2 of the aperture AP2 and an inclined portion IP2 having an island-like shape and spaced apart from the edge E2.

The lower electrode LE3 comprises the flat portion FP3 and the inclined portions IP3 in the aperture AP3. The inclined portions IP3 include an inclined portion IP3 having a frame-like shape and provided along the edge E3 of the aperture AP3 and an inclined portion IP3 having an island-like shape and spaced apart from the edge E3.

The insulating layers which are the bases of the lower electrodes LE1, LE2 and LE3 comprise protrusions PT1, PT2 and PT3 shown by alternate long and short dash lines.

In the lower electrode LE1, of the portion stacked in the protrusion PT1, the portion located in the aperture AP1 forms the inclined portion IP1 having a frame-like shape and the inclined portion IP1 having an island-like shape. The flat portion FP1 is formed between the inclined portion IP1 having a frame-like shape and the inclined portion IP1 having an island-like shape.

In the lower electrode LE2, of the portion stacked in the protrusion PT2, the portion located in the aperture AP2 forms the inclined portion IP2 having a frame-like shape and the inclined portion IP2 having an island-like shape. The flat portion FP2 is formed between the inclined portion IP2 having a frame-like shape and the inclined portion IP2 having an island-like shape.

In the lower electrode LE3, of the portion stacked in the protrusion PT3, the portion located in the aperture AP3 forms the inclined portion IP3 having a frame-like shape and the inclined portion IP3 having an island-like shape. The flat portion FP3 is formed between the inclined portion IP3 having a frame-like shape and the inclined portion IP3 having an island-like shape.

The definition of the inclination ratios in this configuration example 3 is the same as that of the inclination ratios explained in configuration example 1. Thus, explanation thereof is omitted.

Inclination ratios R1, R2 and R3 can be optimized by adjusting the lengths, widths, shapes, numbers, sizes, etc., of the inclined portions IP1, IP2 and IP3.

Now, the cross-sectional structure of the display element 201 is explained. It should be noted that, as the cross-sectional structure of each of the display elements 202 and 203 is substantially the same as that of the display element 201, explanation thereof is omitted.

Figure 24A:
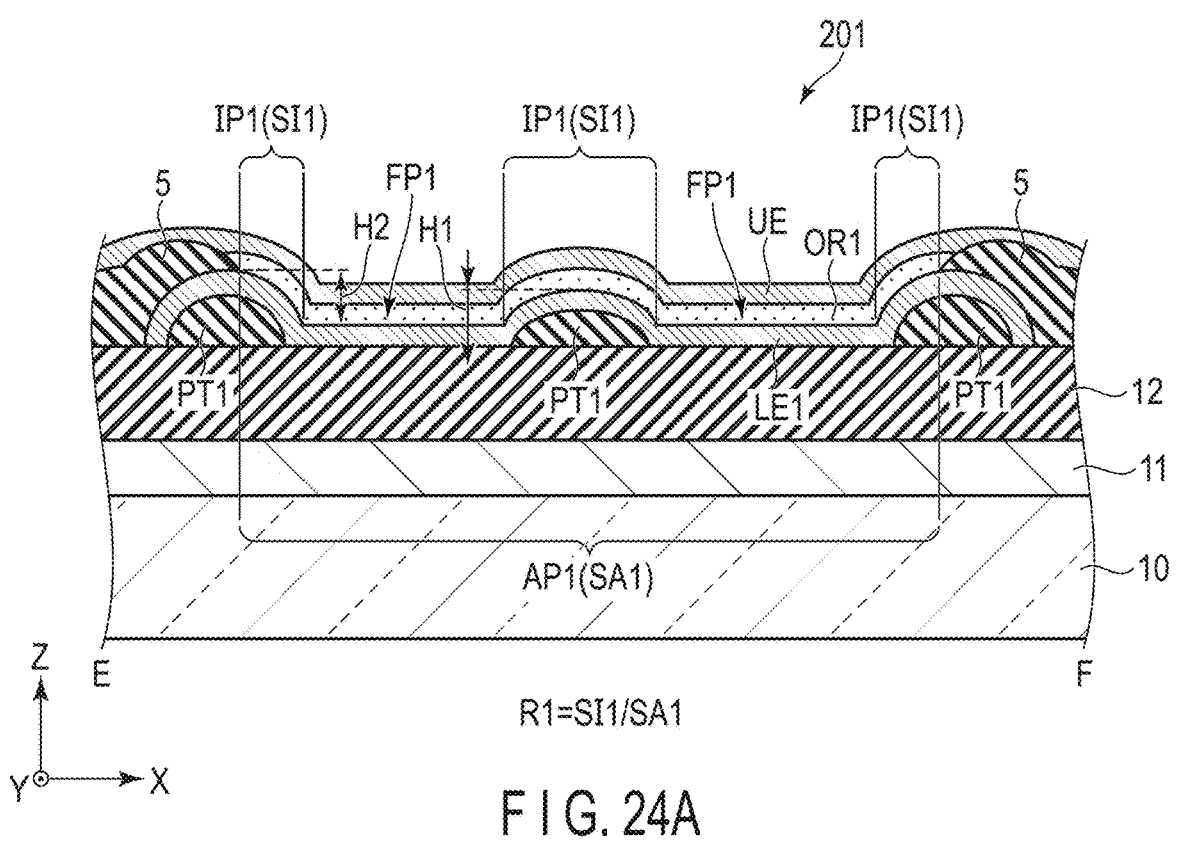
FIG. 24A is a cross-sectional view of the display element 201 along the E-F line of FIG. 23.

FIG. 24A is a cross-sectional view of the display element 201 along the E-F line of FIG. 23.

Figure 24B:
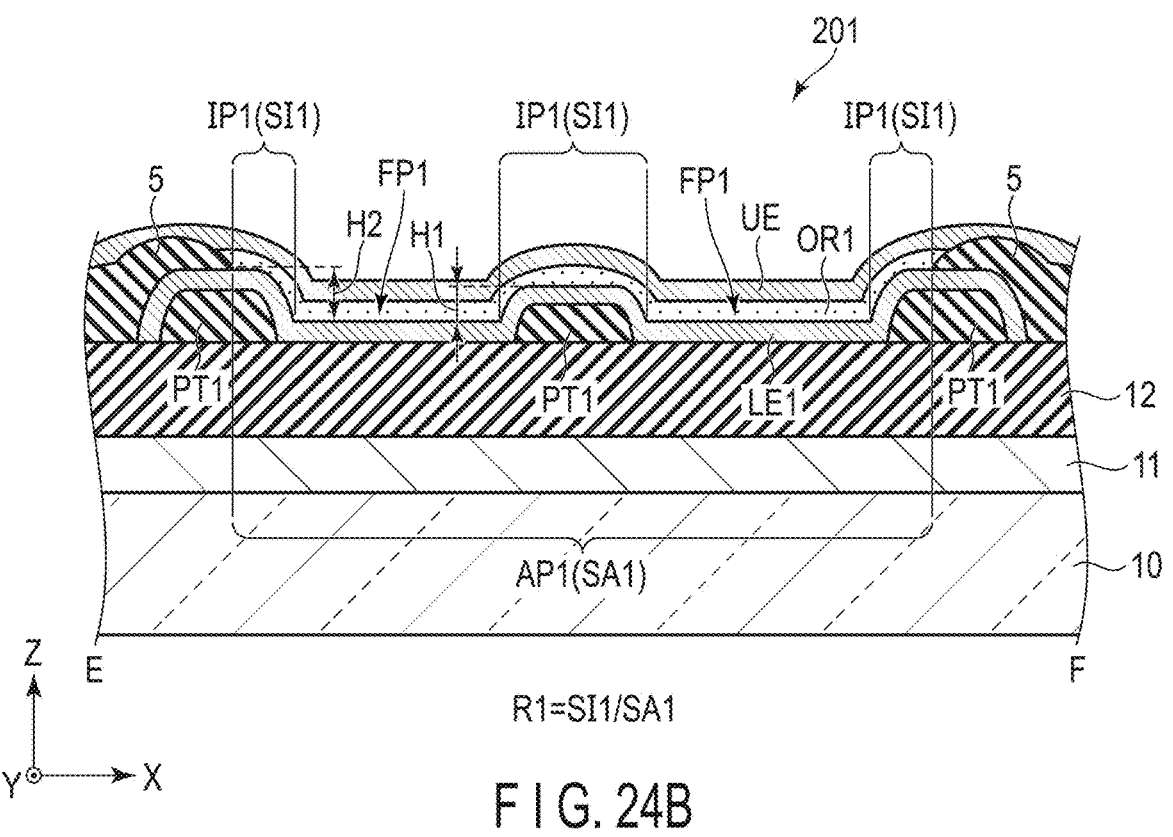
FIG. 24B is another cross-sectional view of the display element 201 along the E-F line of FIG. 23.

FIG. 24B is another cross-sectional view of the display element 201 along the E-F line of FIG. 23.

The circuit layer 11 is provided on the substrate 10 and is covered with the insulating layer 12. The insulating layer 12 is an organic insulating layer. For example, the surface of the insulating layer 12 is substantially parallel to the X-Y plane.

The protrusion PT1 is located on the insulating layer 12. The protrusion PT1 is formed of an organic insulating material.

In the example shown in FIG. 24A, the protrusion PT1 is formed so as to comprise substantially a semicircular section. The surface of the protrusion PT1 is formed as a curved surface.

In the modified example shown in FIG. 24B, the protrusion PT1 is formed so as to comprise substantially a trapezoidal section in which the corners are round. The upper and side surfaces of the protrusion PT1 are connected by curved surfaces and do not form a sharp edge.

It should be noted that the shape of the section of the protrusion PT1 is not limited to the semicircular shape or substantially the trapezoidal shape in which the corners are round as shown in the figures. For example, the shape of the section may be a semielliptical shape. The protrusion PT1 may be formed of the same material as the insulating layer 12 and may be formed integrally with the insulating layer 12.

The lower electrode LE1 is provided on the insulating layer 12, overlaps the protrusion PT1 and comprises the flat portion FP1 and the inclined portion IP1. The rib 5 is provided on the insulating layer 12 and the lower electrode LE1 and overlaps part of the protrusion PT1 along the periphery of the aperture AP1. An end portion of the lower electrode LE1 is located on the protrusion PT1 and is covered with the rib 5.

In the lower electrode LE1, the flat portion FP1 is stacked in the insulating layer 12 and is substantially parallel to the X-Y plane. The inclined portion IP1 is stacked in the protrusion PT1 and inclines relative to the flat portion FP1. Of the lower electrode LE1, the portion which protrudes in the third direction Z relative to the flat portion FP1 can be regarded as the inclined portion IP1 in the aperture AP1. The inclined portion IP1 having an island-like shape has height H1 from the flat portion FP1 in the third direction Z. The inclined portion IP1 having a frame-like shape has height H2 from the flat portion FP1 in the third direction Z. Height H1 is less than height H2.

The organic layer OR1 is in contact with the lower electrode LE1 through the aperture AP1, covers the lower electrode LE1 and overlaps the rib 5. The upper electrode UE faces the lower electrode LE1 and is provided on the organic layer OR1. Further, the upper electrode UE overlaps the rib 5 outside the organic layer OR1.

In this configuration example 3, effects similar to those explained in configuration example 1 and configuration example 2 are obtained.

In configuration example 3, similarly, embodiment 1 to embodiment 4 described above can be applied.

FIG. 25 is a diagram for explaining a process for forming the organic layer OR1 in the display element 201 shown in FIG. 24A.

First, a substrate in which the lower electrode LE1 and the rib 5 are formed is prepared. A mask MK for vapor deposition is provided above the rib 5. A material for forming the organic layer OR1 is deposited on the lower electrode LE1 via the mask MK.

As explained with reference to FIG. 24A, etc., the height of the inclined portion IP1 having an island-like shape and located in the center of the aperture AP1 is less than that of the inclined portion IP1 having a frame-like shape and located in the periphery of the aperture AP1. Therefore, even if the mask MK approaches the rib 5 to the extent that the mask MK is in contact with the rib 5, the contact between the inclined portion IP1 having an island-like shape and the mask MK is avoided. Thus, the display failure of the display element 201 to be caused by the damage to the lower electrode LE1 is prevented.

Now, the sealing structure of the display element 201 is explained. It should be noted that, as the sealing structure of each of the display elements 202 and 203 is substantially the same as that of the display element 201, explanation thereof is omitted.

Figure 26:
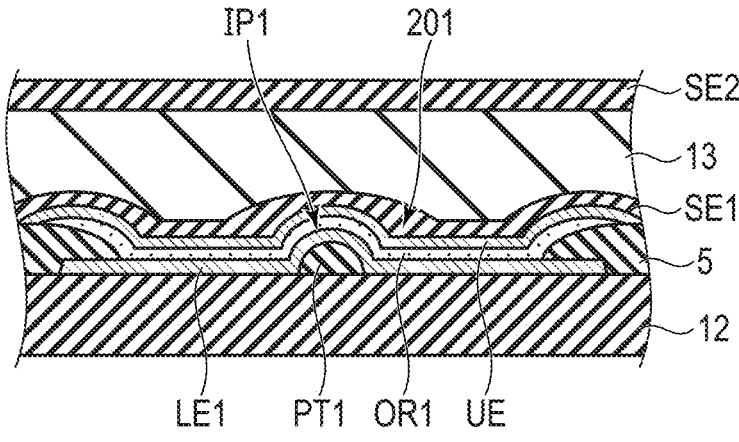
FIG. 26 is a cross-sectional view showing an example of the sealing structure of the display element 201.

FIG. 26 is a cross-sectional view showing an example of the sealing structure of the display element 201.

A first sealing layer SE1 is provided on the upper electrode UE. It should be noted that an optical adjustment layer may be provided between the upper electrode UE and the first sealing layer SE1. A transparent resin layer 13 is provided on the first sealing layer SE1. The resin layer 13 is formed so as to planarize the irregularities formed by the inclined portion IP1 and the rib 5. A second sealing layer SE2 is provided on the resin layer 13. Each of the first sealing layer SE1, the resin layer 13 and the second sealing layer SE2 is a common layer provided over the display elements 201, 202 and 203.

Each of the first sealing layer SE1 and the second sealing layer SE2 is formed of silicon nitride (SiNx) as an example of inorganic insulating materials. It should be noted that each of the first sealing layer SE1 and the second sealing layer SE2 may be formed of, as another inorganic insulating material, silicon oxide (SiOx), silicon oxynitride (SiON) or aluminum oxide ($Al_2O_3$).

When the display element 201 is observed in an oblique direction, to prevent the reflection on the interface between the first sealing layer SE1 and the resin layer 13 or the interface between the resin layer 13 and the second sealing layer SE2, the resin layer 13 and the second sealing layer SE2 may be omitted.

Figure 27:
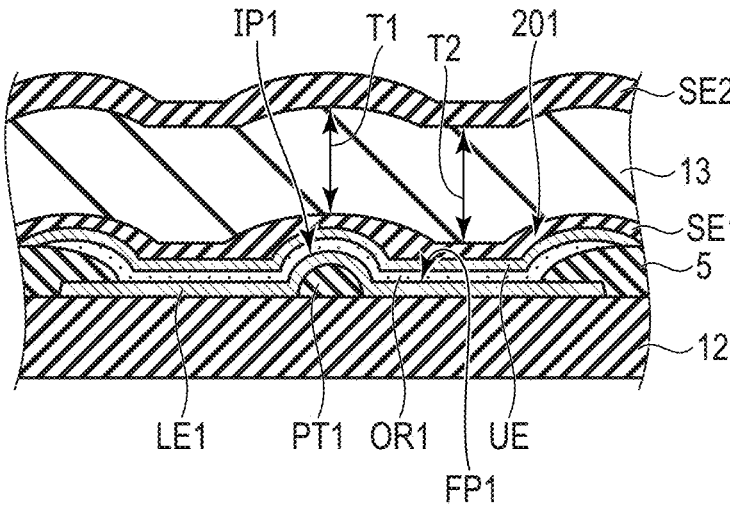
FIG. 27 is a cross-sectional view showing another example of the sealing structure of the display element 201.

FIG. 27 is a cross-sectional view showing another example of the sealing structure of the display element 201.

The example shown in FIG. 27 is different from the example shown in FIG. 26 in respect that the resin layer 13 has substantially a constant thickness so as to follow the irregularities formed by the inclined portion IP1 and the rib 5. In other words, thickness T1 of the resin layer 13 immediately above the inclined portion IP1 is equal to thickness T2 of the resin layer 13 immediately above the flat portion FP1. In this configuration, the interface between the first sealing layer SE1 and the resin layer 13 and the interface between the resin layer 13 and the second sealing layer SE2 are formed as the same curved surfaces as the inclined portion IP1. Thus, when the display element is observed in an oblique direction, the reduction in luminance to be caused by the reflection on these interfaces is prevented, and the viewing angle characteristics of luminance is improved.

It should be noted that the sealing structures explained with reference to FIG. 26 and FIG. 27 can be also applied to all of the above configuration examples 1 to 3.

In the above configuration examples, the lower electrode LE1 corresponds to a first lower electrode. The lower electrode LE2 corresponds to a second lower electrode. The lower electrode LE3 corresponds to a third lower electrode.

The organic layer OR1 corresponds to a first organic layer. The organic layer OR2 corresponds to a second organic layer. The organic layer OR3 corresponds to a third organic layer. The aperture AP1 corresponds to a first aperture. The aperture AP2 corresponds to a second aperture. The aperture AP3 corresponds to a third aperture.

As explained above, the present embodiment can provide a display device having improved viewing angle characteristics.

All of the display devices that can be implemented by a person of ordinary skill in the art through arbitrary design changes to the display device described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiments and are self-explanatory from the descriptions of the specification or can be arbitrarily conceived by a person of ordinary skill in the art are considered as the effects of the present invention as a matter of course.

What is claimed is:

1. A display device comprising:
a substrate;
first, second and third lower electrodes provided above the substrate;
a rib comprising apertures which overlap the first lower electrode, the second lower electrode and the third lower electrode, respectively;
a first organic layer configured to emit light which exhibits a first color and provided on the first lower electrode;
a second organic layer configured to emit light which exhibits a second color different from the first color and provided on the second lower electrode;
a third organic layer configured to emit light which exhibits a third color different from the first color and the second color and provided on the third lower electrode; and
an upper electrode provided on the first organic layer, the second organic layer and the third organic layer, wherein
at least one of the first lower electrode, the second lower electrode and the third lower electrode comprises a flat portion and a plurality of inclined portions which incline relative to the flat portion in the aperture, and
the inclined portions are arrayed in matrix in first and second directions which intersect each other in plan view.

2. The display device of claim 1, wherein
the number of the inclined portions of the first lower electrode is different from the number of the inclined portions of the second lower electrode.

3. The display device of claim 1, wherein
the first lower electrode does not comprise the inclined portion.

4. A display device comprising:
a substrate;
first, second and third lower electrodes provided above the substrate;
a rib comprising apertures which overlap the first lower electrode, the second lower electrode and the third lower electrode, respectively;
a first organic layer configured to emit light which exhibits a first color and provided on the first lower electrode;
a second organic layer configured to emit light which exhibits a second color different from the first color and provided on the second lower electrode;
a third organic layer configured to emit light which exhibits a third color different from the first color and the second color and provided on the third lower electrode; and
an upper electrode provided on the first organic layer, the second organic layer and the third organic layer, wherein
at least one of the first lower electrode, the second lower electrode and the third lower electrode comprises a flat portion and an inclined portion which inclines relative to the flat portion in the aperture, and
the inclined portion is provided along an edge of the aperture.

5. The display device of claim 4, wherein
the inclined portion is provided along a whole circumference of the edge.

6. The display device of claim 4, wherein
the edge extends in first and second directions which intersect each other, and
the inclined portion extends in at least one of the first direction and the second direction.

7. The display device of claim 4, wherein
a length of the inclined portion of the first lower electrode is different from a length of the inclined portion of the second lower electrode.

8. The display device of claim 4, wherein
at least one of the first lower electrode, the second lower electrode and the third lower electrode comprises, as the inclined portion located in the aperture, another inclined portion spaced apart from the edge.

9. The display device of claim 8, wherein
a height of the another inclined portion from the flat portion is less than a height of the inclined portion provided along the edge from the flat portion.

10. The display device of claim 1, wherein
when an area of one of the apertures is defined as SA, and a total area of the inclined portions located in the aperture is defined as SI, and SI/SA is called an inclination ratio,
the inclination ratios of the first lower electrode, the second lower electrode and the third lower electrode are equal to each other.

11. The display device of claim 1, wherein
when an area of one of the apertures is defined as SA, and a total area of the inclined portions located in the aperture is defined as SI, and SI/SA is called an inclination ratio,
the inclination ratio of the second lower electrode is greater than the inclination ratio of the first lower electrode, and
the inclination ratio of the third lower electrode is equal to the inclination ratio of the second lower electrode or greater than the inclination ratio of the second lower electrode.

12. The display device of claim 1, wherein when an area of one of the apertures is defined as SA, and a total area of the inclined portions located in the aperture is defined as SI, and SI/SA is called an inclination ratio, the inclination ratio of the third lower electrode is equal to the inclination ratio of the first lower electrode or greater than the inclination ratio of the first lower electrode, and the inclination ratio of the second lower electrode is greater than the inclination ratio of the third lower electrode.

13. The display device of claim 1, wherein when an area of one of the apertures is defined as SA, and a total area of the inclined portions located in the aperture is defined as SI, and SI/SA is called an inclination ratio, the inclination ratio of the second lower electrode is equal to the inclination ratio of the first lower electrode or greater than the inclination ratio of the first lower electrode, and the inclination ratio of the third lower electrode is greater than the inclination ratio of the second lower electrode.

14. The display device of claim 1, wherein an area of the aperture which overlaps the first lower electrode, and an area of the aperture which overlaps the second lower electrode and an area of the aperture which overlaps the third lower electrode are different from each other.

15. The display device of claim 4, wherein when an area of one of the apertures is defined as SA, and a total area of the inclined portion located in the aperture is defined as SI, and SI/SA is called an inclination ratio, the inclination ratios of the first lower electrode, the second lower electrode and the third lower electrode are equal to each other.

16. The display device of claim 4, wherein when an area of one of the apertures is defined as SA, and a total area of the inclined portion located in the aperture is defined as SI, and SI/SA is called an inclination ratio, the inclination ratio of the second lower electrode is greater than the inclination ratio of the first lower electrode, and the inclination ratio of the third lower electrode is equal to the inclination ratio of the second lower electrode or greater than the inclination ratio of the second lower electrode.

17. The display device of claim 4, wherein when an area of one of the apertures is defined as SA, and a total area of the inclined portion located in the aperture is defined as SI, and SI/SA is called an inclination ratio, the inclination ratio of the third lower electrode is equal to the inclination ratio of the first lower electrode or greater than the inclination ratio of the first lower electrode, and the inclination ratio of the second lower electrode is greater than the inclination ratio of the third lower electrode.

18. The display device of claim 4, wherein when an area of one of the apertures is defined as SA, and a total area of the inclined portion located in the aperture is defined as SI, and SI/SA is called an inclination ratio, the inclination ratio of the second lower electrode is equal to the inclination ratio of the first lower electrode or greater than the inclination ratio of the first lower electrode, and the inclination ratio of the third lower electrode is greater than the inclination ratio of the second lower electrode.

19. The display device of claim 4, wherein an area of the aperture which overlaps the first lower electrode, and an area of the aperture which overlaps the second lower electrode and an area of the aperture which overlaps the third lower electrode are different from each other.

20. The display device of claim 4, further comprising:

a first sealing layer provided on the upper electrode and formed of an inorganic insulating material;

a resin layer provided on the first sealing layer; and a second sealing layer provided on the resin layer and formed of an inorganic insulating material, wherein a thickness of the resin layer immediately above the inclined portion is equal to a thickness of the resin layer immediately above the flat portion.

* * * * *